United States Patent
Wada et al.

(10) Patent No.: US 9,276,106 B2
(45) Date of Patent: Mar. 1, 2016

(54) SILICON CARBIDE SEMICONDUCTOR DEVICE AND METHOD FOR MANUFACTURING SAME

(71) Applicant: Sumitomo Electric Industries, Ltd., Osaka (JP)

(72) Inventors: Keiji Wada, Osaka (JP); Takeyoshi Masuda, Osaka (JP); Toru Hiyoshi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/651,985

(22) PCT Filed: Dec. 4, 2013

(86) PCT No.: PCT/JP2013/082560
§ 371 (c)(1),
(2) Date: Jun. 12, 2015

(87) PCT Pub. No.: WO2014/112233
PCT Pub. Date: Jul. 24, 2014

(65) Prior Publication Data
US 2015/0372128 A1 Dec. 24, 2015

(30) Foreign Application Priority Data
Jan. 21, 2013 (JP) ................................ 2013-008104

(51) Int. Cl.
*H01L 29/00* (2006.01)
*H01L 29/78* (2006.01)
(Continued)

(52) U.S. Cl.
CPC ........ *H01L 29/7811* (2013.01); *H01L 29/0619* (2013.01); *H01L 29/1608* (2013.01); *H01L 29/4236* (2013.01); *H01L 29/66068* (2013.01); *H01L 29/7813* (2013.01)

(58) Field of Classification Search
CPC ............ H01L 29/7811; H01L 29/0619; H01L 29/7813; H01L 29/1608; H01L 29/66068; H01L 29/4236
See application file for complete search history.

(56) References Cited

U.S. PATENT DOCUMENTS

| 5,895,939 A | 4/1999 | Ueno |
| 6,037,632 A | 3/2000 | Omura et al. |

(Continued)

FOREIGN PATENT DOCUMENTS

| JP | H09-36359 A | 2/1997 |
| JP | 09-191109 A | 7/1997 |

(Continued)

OTHER PUBLICATIONS

International Search Report in PCT International Application No. PCT/JP2013/082560, dated Feb. 10, 2014.

*Primary Examiner* — Nikolay Yushin
(74) *Attorney, Agent, or Firm* — Venable LLP; Michael A. Sartori

(57) ABSTRACT

A silicon carbide film includes a first range having a first breakdown voltage holding layer, a charge compensation region, a first junction terminal region, and a first guard ring region. The silicon carbide film includes a second range having a second breakdown voltage holding layer, a channel forming region, and a source region. The first and second breakdown voltage holding layers constitutes a breakdown voltage holding region having a thickness in an element portion. When voltage is applied to attain a maximum electric field strength of 0.4 MV/cm or more in the breakdown voltage holding region during an OFF state, a maximum electric field strength in the second range within the element portion is configured to be less than ⅔ of a maximum electric field strength in the first range.

7 Claims, 20 Drawing Sheets

(51) Int. Cl.
*H01L 29/16* (2006.01)
*H01L 29/06* (2006.01)
*H01L 29/423* (2006.01)
*H01L 29/66* (2006.01)

(56) References Cited

U.S. PATENT DOCUMENTS

| | | | |
|---|---|---|---|
| 6,057,558 A * | 5/2000 | Yamamoto | H01L 29/0847 257/330 |
| 6,091,108 A | 7/2000 | Harris et al. | |
| 6,452,228 B1 * | 9/2002 | Okuno | H01L 21/049 257/329 |
| 2001/0045567 A1 | 11/2001 | Auerbach et al. | |
| 2002/0096715 A1 | 7/2002 | Sumida et al. | |
| 2005/0077591 A1 * | 4/2005 | Fukuda | H01L 29/045 257/500 |
| 2009/0090968 A1 | 4/2009 | Ono et al. | |
| 2012/0326166 A1 | 12/2012 | Masuda et al. | |

FOREIGN PATENT DOCUMENTS

| | | |
|---|---|---|
| JP | 2001-523895 A | 11/2001 |
| JP | 2002-222949 A | 8/2002 |
| JP | 2002-525872 A | 8/2002 |
| JP | 2009-088345 A | 4/2009 |
| JP | 2013-008890 A | 1/2013 |

* cited by examiner

SILICON CARBIDE SEMICONDUCTOR DEVICE AND METHOD FOR MANUFACTURING SAME

TECHNICAL FIELD

The present invention relates to a silicon carbide semiconductor device and a method for manufacturing the silicon carbide semiconductor device.

BACKGROUND ART

Regarding a Si (silicon) MOSFET (Metal Oxide Semiconductor Field Effect Transistor), which is a power semiconductor device used widely, a main determination factor for breakdown voltage is the upper limit of an electric field strength with which a drift layer serving as a breakdown voltage holding region can withstand. A drift layer made of Si can be broken at a portion fed with an electric field of about 0.3 MV/cm or more. Accordingly, it is required to suppress the electric field strength to be less than a predetermined value in the entire breakdown voltage holding region of the MOSFET. The simplest method is to provide the breakdown voltage holding region with a low impurity concentration. However, this method provides a large on-resistance of the MOSFET, disadvantageously. In other words, there is a trade-off relation between the on-resistance and the breakdown voltage.

Regarding a typical Si MOSFET, Japanese Patent Laying-Open No. 9-191109 illustrates a trade-off relation between the on-resistance and the breakdown voltage in consideration of a theoretical limit resulting from a property value of Si. In order to cancel this trade off, it is disclosed to add a lower p type embedded layer and an upper p type embedded layer in an n base layer provided on an n type substrate provided on a drain electrode. By the lower p type embedded layer and the upper embedded layer, the n base layer is divided into a lower stage, a middle stage, and an upper stage, each of which has an equal thickness. According to this publication, voltage is equally held by each of the three stages, whereby the maximum electric field of each stage is maintained to be equal to or less than the critical electric field strength.

CITATION LIST

Patent Document

PTD 1: Japanese Patent Laying-Open No. 9-191109

SUMMARY OF INVENTION

Technical Problem

As a method for providing further improvement with regard to the trade off described above, it has been actively discussed to use SiC (silicon carbide) instead of Si in recent years. SiC is a material capable of sufficiently withstanding an electric field strength of 0.4 MV/cm or more unlike Si. Hence, a SiC MOSFET is capable of withstanding an electric field higher than a Si MOSFET is. When such a high electric field is applied, a problem arises in terms of breakage resulting from electric field concentration at a specific position in the MOSFET structure. For example, in the case of a trench type MOSFET, a breakage phenomenon of a gate insulating film caused by electric field concentration in the gate insulating film at the bottom portion, in particular, a corner portion of the trench is a main determination factor for breakdown voltage. Thus, the determination factor for breakdown voltage differs between the Si semiconductor device and the SiC semiconductor device. Hence, if the technique of the above-described publication, which assumes use of Si, is simply applied in order to improve the breakdown voltage of the SiC semiconductor device, the advantage of the physical properties of SiC is not sufficiently used to attain improvement in breakdown voltage.

The present invention has been made to solve the problem described above, and has an object to provide a silicon carbide semiconductor device having a high breakdown voltage and a method for manufacturing the silicon carbide semiconductor device.

Solution to Problem

A silicon carbide semiconductor device of the present invention includes an element portion provided with a semiconductor element and a termination portion surrounding the element portion. The silicon carbide semiconductor device includes a silicon carbide film, a gate insulating film, a gate electrode, a first main electrode, and a second main electrode. The silicon carbide film has a first main surface and a second main surface opposite to the first main surface. The silicon carbide film has a first range and a second range, the first range constituting the first main surface, the second range constituting the second main surface. The first and second ranges having an interface separated from the first and second main surfaces between the first and second ranges. The first range includes a first breakdown voltage holding layer, a charge compensation region, a first junction terminal region, and a first guard ring region. The first breakdown voltage holding layer constitutes the first main surface and has a first conductivity type. The charge compensation region is partially provided in the element portion at the interface and has a second conductivity type. The first junction terminal region is partially provided in the termination portion at the interface, is in contact with the charge compensation region, surrounds the element portion, has the second conductivity type, and has an impurity concentration lower than an impurity concentration of the charge compensation region. The first guard ring region is provided to be separated from the first junction terminal region in the termination portion at the interface, surrounds the element portion at the interface, and has the second conductivity type. The second range includes a second breakdown voltage holding layer, a channel forming region, and a source region. The second breakdown voltage holding layer constitutes the interface and has the first conductivity type. The channel forming region is provided in the element portion at the second breakdown voltage holding layer and has the second conductivity type. The source region is provided on the channel forming region, is separated from the second breakdown voltage holding layer by the channel forming region, and has the first conductivity type. The first and second breakdown voltage holding layers constitute a breakdown voltage holding region in the element portion. The gate insulating film has a portion connecting the second breakdown voltage holding layer and the source region to each other on the channel forming region. The gate electrode is for switching between an ON state and an OFF state of the silicon carbide semiconductor device, the gate electrode being provided on the gate insulating film. The first main electrode faces the first main surface. The second main electrode is in contact with the source region on the second main surface. When voltage is applied between the first and second main electrodes to attain a maximum electric field strength of 0.4 MV/cm or more in the breakdown voltage holding region during the OFF state, the silicon carbide semiconductor device is configured such that a maximum electric field strength in the second range within the element portion is less than ⅔ of a maximum electric field strength in the first range.

According to the above-described silicon carbide semiconductor device, silicon carbide is used as the material of the semiconductor device, so that it is possible to handle a high voltage with which the breakdown voltage holding region of the semiconductor device is fed with a maximum electric field of 0.4 MV/cm or more. Moreover, the silicon carbide semiconductor device is configured such that the maximum electric field strength in the second range within the element portion is less than ⅔ of the maximum electric field strength in the first range. Accordingly, the electric field strength in the second range within the element portion, which serves as a determination factor for breakdown voltage, is made lower. Conversely, when the maximum electric field strength in the first range exceeds an electric field strength 1.5 times as large as the maximum electric field strength in the second range within the element portion, the maximum electric field strength in the first range, which does not serve as the determination factor for breakdown voltage, is made higher. Accordingly, high voltage can be applied to the silicon carbide semiconductor device. In other words, the breakdown voltage can be increased.

The second range may include a second junction terminal region and a second guard ring region. The second junction terminal region is partially provided in the termination portion at the second main surface, is in contact with the channel forming region, surrounds the element portion, has the second conductivity type, and has an impurity concentration lower than an impurity concentration of the channel forming region. The second guard ring region is provided to be separated from the second junction terminal region in the termination portion at the second main surface, surrounds the element portion at the second main surface, and has the second conductivity type. Accordingly, the breakdown voltage can be increased more.

The silicon carbide film may have a trench. The trench has a side wall surface including a portion constituted of the channel forming region. The gate electrode is disposed on the side wall surface with the gate insulating film being interposed therebetween. Accordingly, the breakdown voltage of the trench type silicon carbide semiconductor device can be increased.

The side wall surface of the trench may include a first plane having a plane orientation of {0-33-8}. In this case, a channel is formed in the surface having a plane orientation of {0-33-8}, thereby reducing a ratio of the channel resistance in the on-resistance. Therefore, while maintaining the on-resistance to be equal to or less than a predetermined value, resistance by the breakdown voltage holding region can be increased. Therefore, the impurity concentration of the breakdown voltage holding region can be made lower. Accordingly, the breakdown voltage can be more increased.

The side wall surface of the trench may microscopically include the first plane. The side wall surface may microscopically further include a second plane having a plane orientation of {0-11-1}. Accordingly, the on-resistance can be further suppressed. Therefore, due to the same reason mentioned above, the breakdown voltage can be increased more.

The first and second planes of the side wall surface of the trench may constitute a combined plane having a plane orientation of {0-11-2}. Accordingly, the on-resistance can be suppressed. Therefore, due to the same reason mentioned above, the breakdown voltage can be increased more.

A method for manufacturing a silicon carbide semiconductor device in the present invention is a method for manufacturing a silicon carbide semiconductor device including an element portion provided with a semiconductor element and a termination portion surrounding the element portion. The silicon carbide semiconductor device has a silicon carbide film having a first main surface and a second main surface opposite to the first main surface. The silicon carbide film has a first range and a second range, the first range constituting the first main surface, the second range constituting the second main surface. The first and second ranges have an interface separated from the first and second main surfaces between the first and second ranges. The method for manufacturing the silicon carbide semiconductor device includes the following steps.

There is formed the first range on a substrate. The step of forming the first range includes the step of forming a first breakdown voltage holding layer and the step of forming a charge compensation region, a first junction terminal region, and a first guard ring region after the step of forming the first breakdown voltage holding layer, the first breakdown voltage holding layer constituting the first main surface and having a first conductivity type, the charge compensation region being partially provided in the element portion at the interface and having a second conductivity type, the first junction terminal region being partially provided in the termination portion at the interface, the first junction terminal region being in contact with the charge compensation region, the first junction terminal region surrounding the element portion, the first junction terminal region having the second conductivity type, the first junction terminal region having an impurity concentration lower than an impurity concentration of the charge compensation region, the first guard ring region being provided to be separated from the first junction terminal region in the termination portion at the interface, the first guard ring region surrounding the element portion at the interface, the first guard ring region having the second conductivity type. There is formed the second range after the step of forming the first range. The step of forming the second range includes the step of forming a second breakdown voltage holding layer and the step of forming a channel forming region and a source region, the second breakdown voltage holding layer constituting the interface and having the first conductivity type, the channel forming region being provided in the element portion at the second breakdown voltage holding layer and having the second conductivity type, the source region being provided at the channel forming region, the source region being separated from the second breakdown voltage holding layer by the channel forming region, the source region having the first conductivity type. The first and second breakdown voltage holding layers constitute a breakdown voltage holding region in the element portion. There is formed a gate insulating film having a portion connecting the second breakdown voltage holding layer and the source region to each other on the channel forming region. There is formed a gate electrode for switching between an ON state and an OFF state of the silicon carbide semiconductor device, the gate electrode being provided on the gate insulating film. There is formed a first main electrode facing the first main surface. There is formed a second main electrode in contact with the source region on the second main surface. When voltage is applied between the first and second main electrodes to attain a maximum electric field strength of 0.4 MV/cm or more in the breakdown voltage holding region during the OFF state, the silicon carbide semiconductor device is configured such that a maximum electric field strength in the second range within the element portion is less than ⅔ of a maximum electric field strength in the first range.

According to the above-described method for manufacturing the silicon carbide semiconductor device, silicon carbide is used as the material of the semiconductor device, so that it is possible to handle a high voltage with which the breakdown voltage holding region of the semiconductor device is fed with a maximum electric field of 0.4 MV/cm or more. Moreover, the maximum electric field strength in the second range within the element portion is configured to be less than ⅔ of the maximum electric field strength in the first range. Accordingly, the electric field strength in the second range within the element portion, which serves as a determination factor for breakdown voltage, is made lower. Conversely, when the maximum electric field strength in the first range is configured to exceed an electric field strength 1.5 times as large as the maximum electric field strength in the second range within the element portion, the maximum electric field strength in the first range, which does not serve as the determination factor for breakdown voltage, is made higher. Accordingly, high voltage can be applied to the silicon carbide semiconductor device. In other words, the breakdown voltage can be increased.

Advantageous Effects of Invention

According to the present invention, the breakdown voltage of the silicon carbide semiconductor device can be increased as described above.

DESCRIPTION OF EMBODIMENTS

Figure 1:
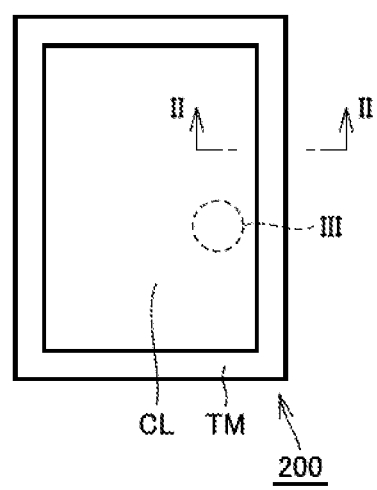
FIG. 1 is a plan view schematically showing a configuration of a silicon carbide semiconductor device in one embodiment of the present invention.

The following describes an embodiment of the present invention based on figures. It should be noted that in the below-mentioned figures, the same or corresponding portions are given the same reference characters and are not described repeatedly. Regarding crystallographic indications in the present specification, an individual orientation is represented by [ ], a group orientation is represented by < >, and an individual plane is represented by ( ), and a group plane is represented by { }. In addition, a negative crystallographic index is normally expressed by putting "-" (bar) above a numeral, but is expressed by putting the negative sign before the numeral in the present specification.

(Configuration of Silicon Carbide Semiconductor Device)

As shown in FIG. 1, a MOSFET 200 (silicon carbide semiconductor device) includes: an element portion CL provided with a transistor element (semiconductor element); and a termination portion TM surrounding element portion CL.

Figure 2:
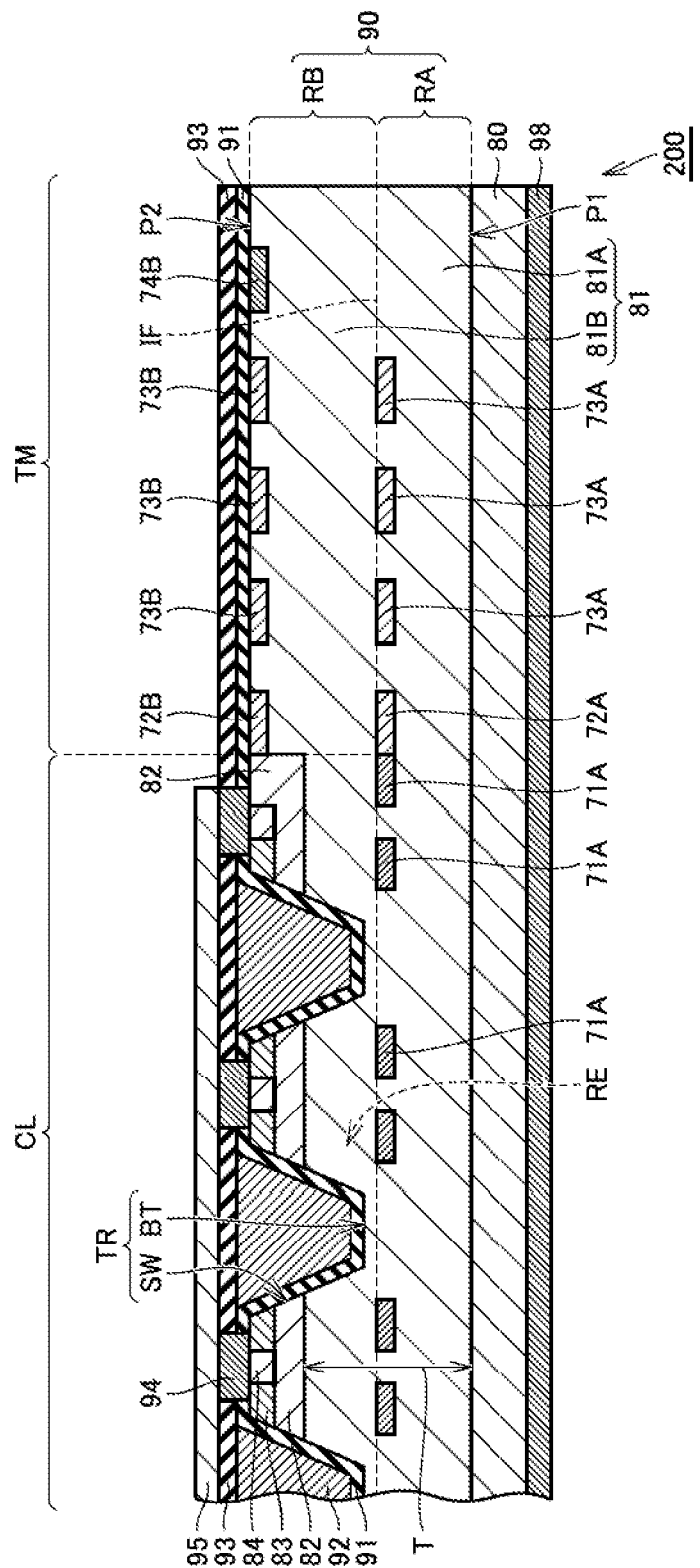
FIG. 2 is a schematic partial cross sectional view along a line II-II of FIG. 1.

As shown in FIG. 2, MOSFET 200 has a single-crystal substrate 80 (substrate), an epitaxial film 90 (silicon carbide film), a gate oxide film 91 (gate insulating film), a gate electrode 92, a drain electrode 98 (first main electrode), a source electrode 94 (second main electrode), an interlayer insulating film 93, and a source interconnection layer 95.

Single-crystal substrate 80 is made of n type (first conductivity type) silicon carbide, preferably has a hexagonal crystal structure, and more preferably has polytype 4H.

Epitaxial film 90 (FIG. 3) is a film formed epitaxially on single-crystal substrate 80. Epitaxial film 90 has a lower surface P1 (first main surface) in contact with single-crystal substrate 80, and an upper surface P2 (second main surface opposite to the first main surface) Epitaxial film 90 has a lower range RA (first range) constituting lower surface P1, and an upper range RB (second range) constituting upper surface P2. Lower range RA and upper range RB has an interface IF separated from lower surface P1 and upper surface P2 between lower range RA and upper range RB.

Lower range RA has a lower drift layer 81A (first breakdown voltage holding layer), a charge compensation region 71A, an embedded JTE (Junction Termination Extension) region 72A (first junction terminal region), and an embedded guard ring region 73A (first guard ring region).

Lower drift layer 81A constitutes lower surface P1. Lower drift layer 81A has n type and preferably has an impurity concentration lower than the impurity concentration of single-crystal substrate 80. Lower drift layer 81A preferably has an impurity concentration of not less than $1\times10^{15}$ cm$^{-3}$ and not more than $5\times10^{16}$ cm$^{-3}$, such as $8\times10^{15}$ cm$^{-3}$.

Charge compensation region 71A is partially provided at interface IF in element portion CL. Charge compensation region 71A has p type (second conductivity type different from the first conductivity type), and preferably has an impurity concentration of not less than about $2.5\times10^{13}$ cm$^{-3}$.

In termination portion TM, embedded JTE region 72A is partially provided at interface IF, is in contact with charge compensation region 71A, and surrounds element portion CL. Embedded JTE region 72A has p type and has an impurity concentration lower than the impurity concentration of charge compensation region 71A.

Embedded guard ring region 73A is provided to be separated from embedded JTE region 72A at interface IF in termination portion TM, and surrounds element portion CL at interface IF. Embedded guard ring region 73A has p type, and has the same impurity concentration as the impurity concentration of embedded JTE region 72A, for example.

Figure 3:
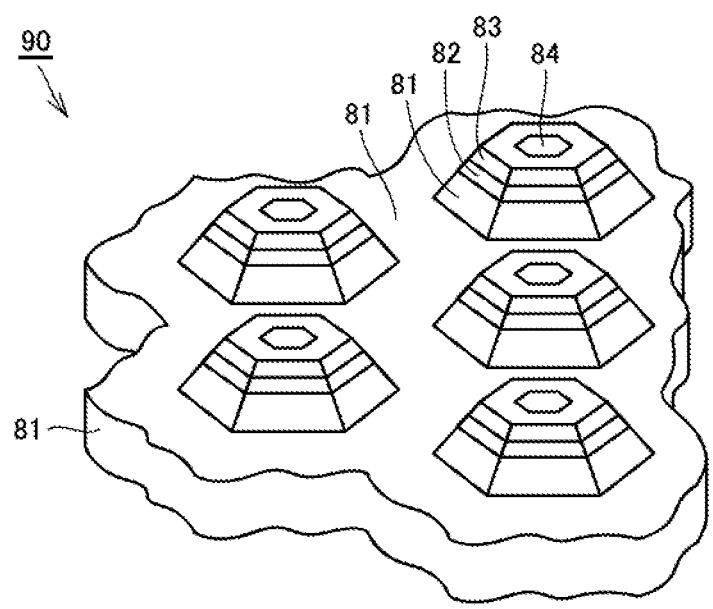
FIG. 3 is a schematic partial cross sectional perspective view of a silicon carbide film included in the silicon carbide semiconductor device in a broken line portion III of FIG. 1.

As shown in FIG. 2 and FIG. 3, upper range RB has an upper drift layer 81B (second breakdown voltage holding layer), a base layer 82 (channel forming region), a source region 83, a contact region 84, an upper JTE region 72B (second junction terminal region), an upper guard ring region 73B (second guard ring region), and a field stop region 74B.

Upper drift layer 81B constitutes interface IF. Upper drift layer 81B has n type, and has the same impurity concentration as the impurity concentration of lower drift layer 81A, for example.

In element portion CL, base layer 82 is provided on upper drift layer 81B. Base layer 82 has p type and has an impurity concentration of $1\times10^-$ cm$^{-3}$, for example. Source region 83 is provided on base layer 82, and is separated from upper drift layer 81B by base layer 82. Source region 83 has n type. Contact region 84 is connected to base layer 82. Contact region 84 has p type.

In termination portion TM, upper JTE region 72B is partially provided at upper surface P2, is in contact with base layer 82, and surrounds element portion CL. Upper JTE region 72B has p type, and has an impurity concentration lower than the impurity concentration of base layer 82.

Upper guard ring region 73B is provided to be separated from upper JTE region 72B in termination portion TM at upper surface P2, and surrounds element portion CL at upper surface P2. Upper guard ring region 73B has p type, and has the same impurity concentration as the impurity concentration of upper JTE region 72B, for example.

At upper surface P2, field stop region 74B surrounds element portion CL, upper JTE region 72B, and upper guard ring region 73B. Field stop region 74B has n type, and has an impurity concentration higher than the impurity concentration of upper drift layer 81B.

In upper range RB of epitaxial film 90, a trench TR is provided at upper surface P2. Trench TR has a side wall surface SW and a bottom surface BT. Side wall surface SW extends to upper drift layer 81B through source region 83 and base layer 82. Therefore, side wall surface SW includes a portion constituted of base layer 82. Side wall surface SW includes a channel surface of MOSFET 200 on base layer 82.

Side wall surface SW is inclined relative to upper surface P2 of epitaxial film 90, and therefore expands in a tapered manner toward the opening of trench TR. The plane orientation of side wall surface SW is preferably inclined by not less than 50° and not more than 80° relative to a {000-1} plane, and is more preferably inclined by not less than 50° and not more than 80° relative to a (000-1) plane.

Side wall surface SW may have one of plane orientations of {0-33-8}, {0-11-2}, {0-11-4} and {0-11-1} when viewed macroscopically. It should be noted that the plane orientation of {0-33-8} has an off angle of 54.7° relative to the {000-1} plane. The plane orientation of {0-11-1} has an off angle of 75.1° relative to the {000-1} plane. Therefore, the plane orientations of {0-33-8}, {0-11-2}, {0-11-4}, and {0-11-1} correspond to off angles of 54.7° to 75.1°. In view of such a fact that there is considered a production error of about 5° with regard to the off angle, a process is performed to incline side wall surface SW by about not less than 50° and not more than 80° relative to the {000-1} plane, whereby the macroscopic plane orientation of side wall surface SW is likely to correspond to one of {0-33-8}, {0-11-2}, {0-11-4} and {0-11-1}.

Preferably, side wall surface SW has a predetermined crystal plane (also referred to as "special plane") particularly at the portion on base layer 82. Details of the special plane will be described later.

Bottom surface BT is separated from lower range RA by upper range RB. In the present embodiment, bottom surface BT has a flat shape substantially parallel to upper surface P2 of epitaxial film 90. It should be noted that bottom surface BT may not be a flat surface and may be substantially in the form of point when viewed in the cross section of FIG. 2, and in this case, trench TR has a V shape.

Gate oxide film 91 covers each of side wall surface SW and bottom surface BT of trench TR. Gate oxide film 91 has a portion connecting upper drift layer 81B and source region 83 to each other on base layer 82.

Gate electrode 92 is for switching between the ON state and the OFF state of MOSFET 200. Gate electrode 92 is provided on gate oxide film 91. Gate electrode 92 is disposed on side wall surface SW with gate oxide film 91 interposed therebetween.

Source electrode 94 is contact with each of source region 83 and contact region 84 on upper surface P2. Source electrode 94 is an ohmic electrode and is made of silicide, for example. Source interconnection layer 95 is in contact with source electrode 94. Source interconnection layer 95 is, for example, an aluminum layer. Interlayer insulating film 93 insulates between gate electrode 92 and source interconnection layer 95.

Drain electrode 98 faces lower surface P1. Specifically, drain electrode 98 is provided on lower surface P1 of epitaxial film 90 with single-crystal substrate 80 being interposed therebetween.

Lower drift layer 81A and upper drift layer 81B constitute drift region 81 (breakdown voltage holding region) having a thickness T in element portion CL. MOSFET 200 is configured such that when voltage is applied between source electrode 94 and drain electrode 98 to attain a maximum electric field strength of 0.4 MV/cm or more in the breakdown voltage holding region during the OFF state, the maximum electric field strength in upper range RB within element portion CL (region indicated by an arrow RE of FIG. 2) becomes less than ⅔ of the maximum electric field strength in lower range RA. Such a configuration can be obtained by providing sufficiently high impurity dose amounts of charge compensation region 71A, embedded JTE region 72A, and embedded guard ring region 73A.

(Method for Manufacturing Silicon Carbide Semiconductor Device)

The following describes a method for manufacturing MOSFET 200.

Figure 4:
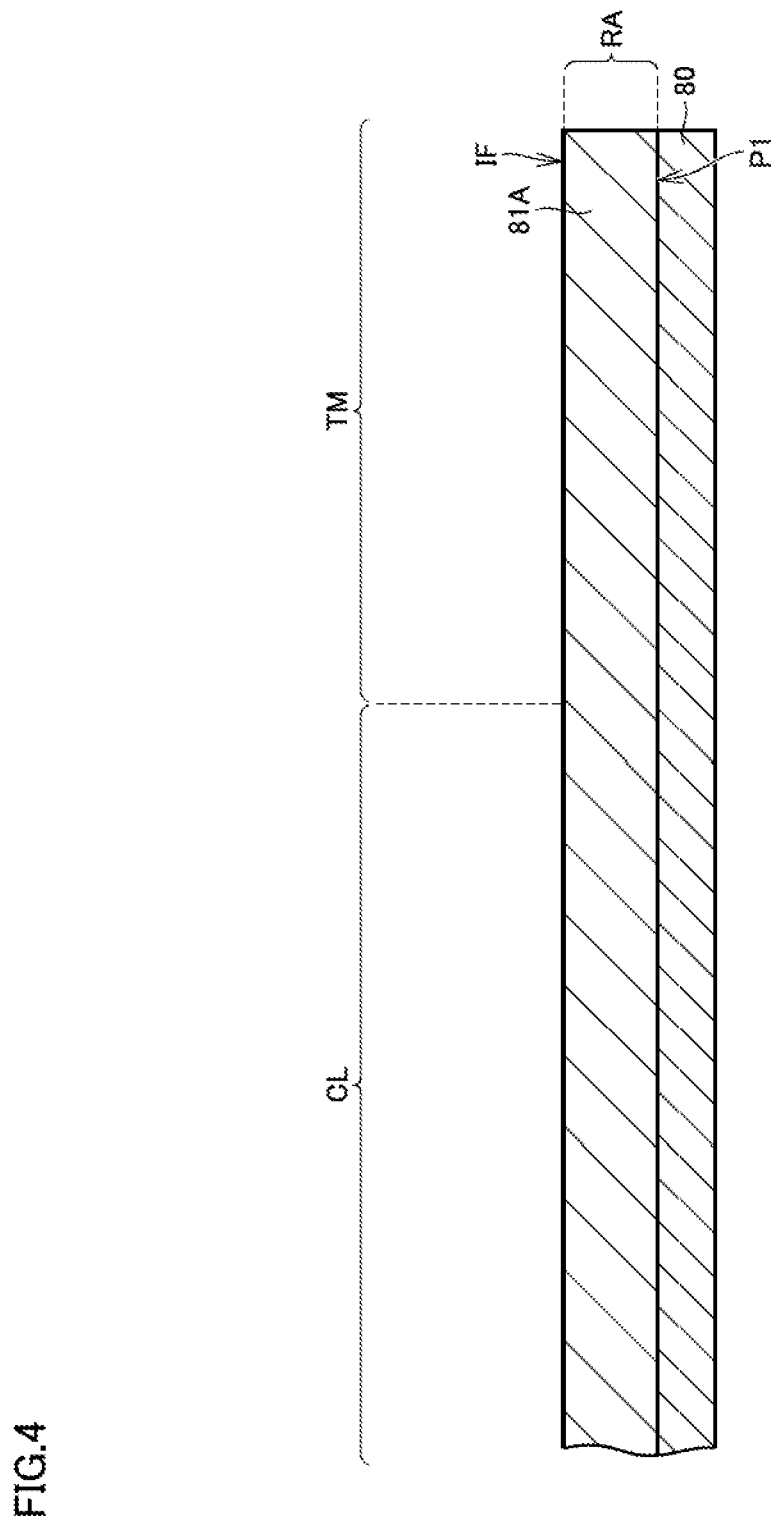
FIG. 4 is a partial cross sectional view schematically showing a first step of a method for manufacturing the silicon carbide semiconductor device of FIG. 2.
Figure 5:
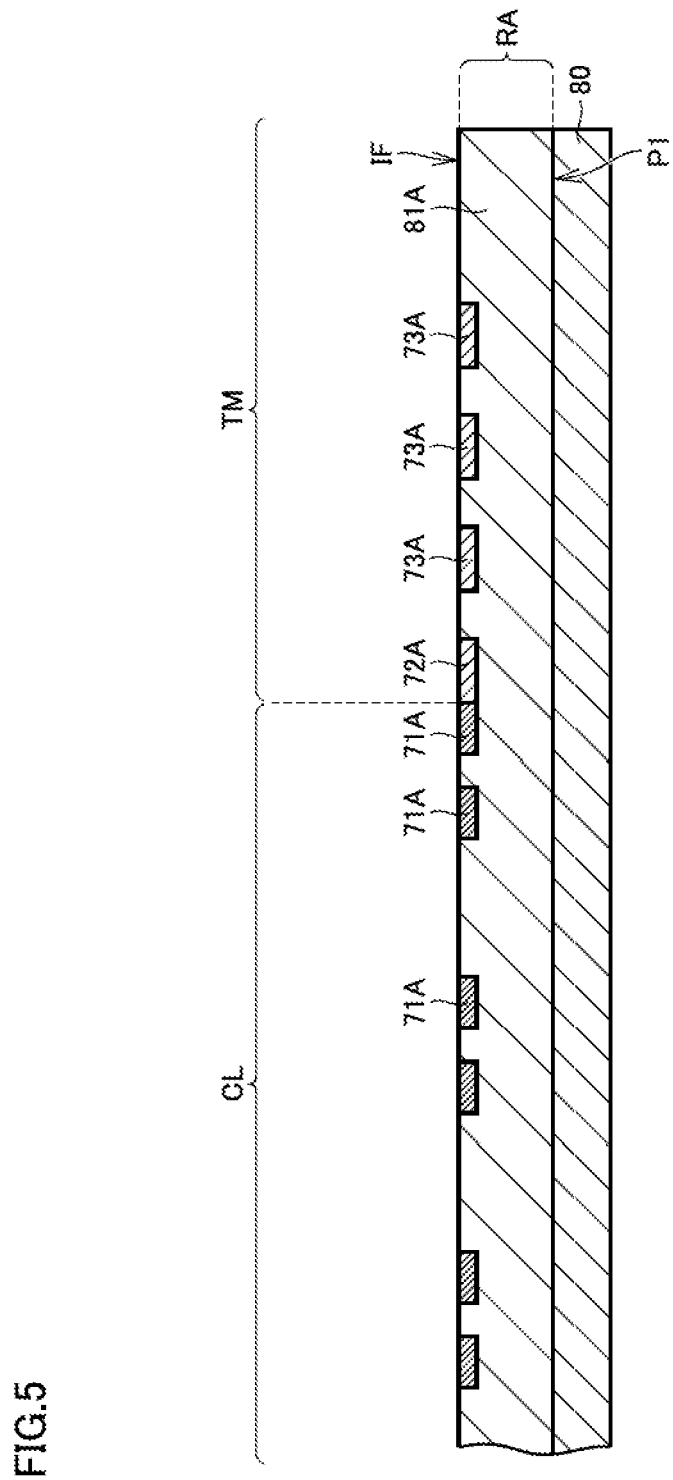
FIG. 5 is a partial cross sectional view schematically showing a second step of the method for manufacturing the silicon carbide semiconductor device of FIG. 2.

As shown in FIG. 4 and FIG. 5, lower range RA is formed on single-crystal substrate 80.

First, as shown in FIG. 4, on single-crystal substrate 80, lower drill layer 81A is formed by means of epitaxial growth of silicon carbide (FIG. 4). The surface of single-crystal substrate 80 on which the epitaxial growth is performed preferably has an off angle of 8° or less relative to the {000-1} plane, and more preferably has an off angle of 8° or less relative to the (000-1) plane. The epitaxial growth can be performed by the CVD method. As a source material gas, a mixed gas of silane ($SiH_4$) and propane ($C_3H_8$) can be used, for example. In doing so, it is preferable to introduce nitrogen (N) or phosphorus (P) as an impurity, for example.

Next, as shown in FIG. 5, impurity regions are formed by impurity ion implantation into interface IF, which is exposed at this point of time. Specifically, charge compensation region 71A is partially formed at interface IF in element portion CL. Moreover, embedded JTE region 72A and embedded guard ring region 73A are partially formed at interface IF in termination portion TM. The impurity regions can be formed in any order. In the present embodiment, an impurity for providing p type, i.e., an acceptor, is implanted. As the acceptor, aluminum can be used, for example.

As shown in FIG. 6 to FIG. 10, upper range RB is formed.

Figure 6:
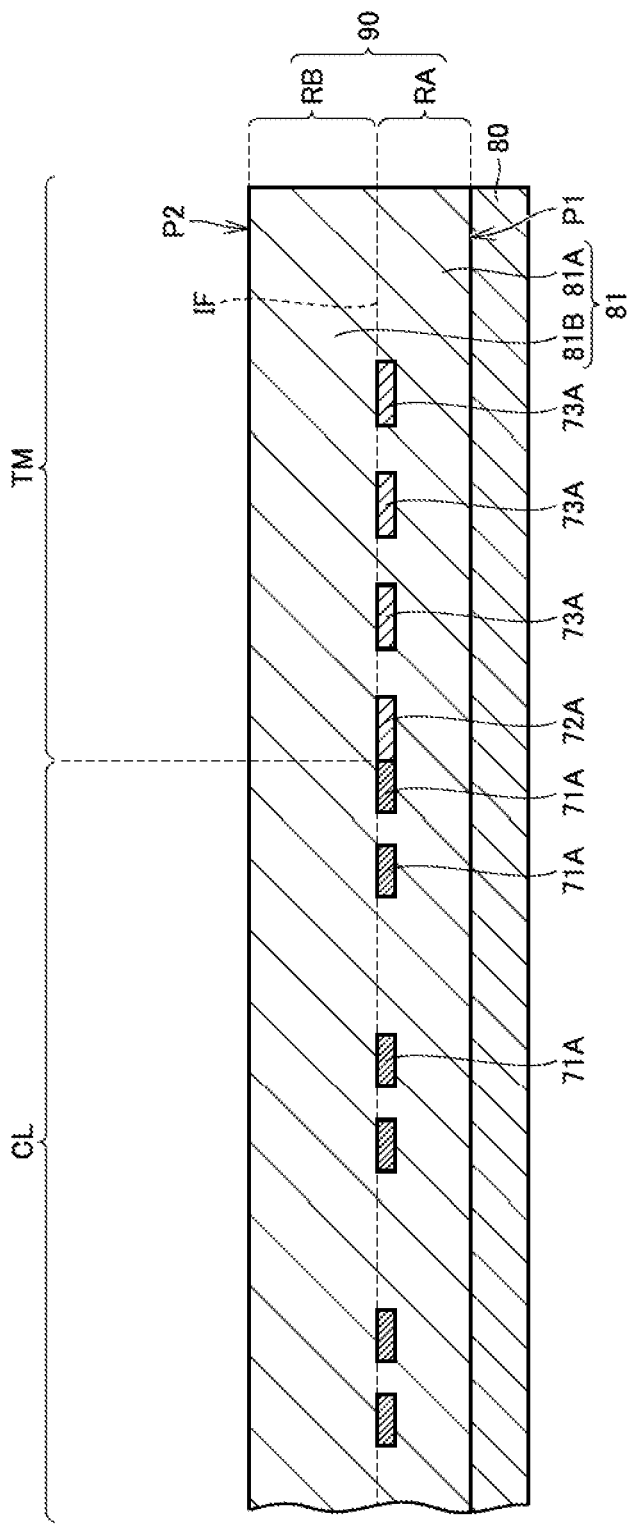
FIG. 6 is a partial cross sectional view schematically showing a third step of the method for manufacturing the silicon carbide semiconductor device of FIG. 2.

First, as shown in FIG. 6, upper drift layer 81B is formed by the same method as that for lower drift layer 81A. Accordingly, epitaxial film 90 having lower range RA and upper range RB is obtained.

Figure 7:
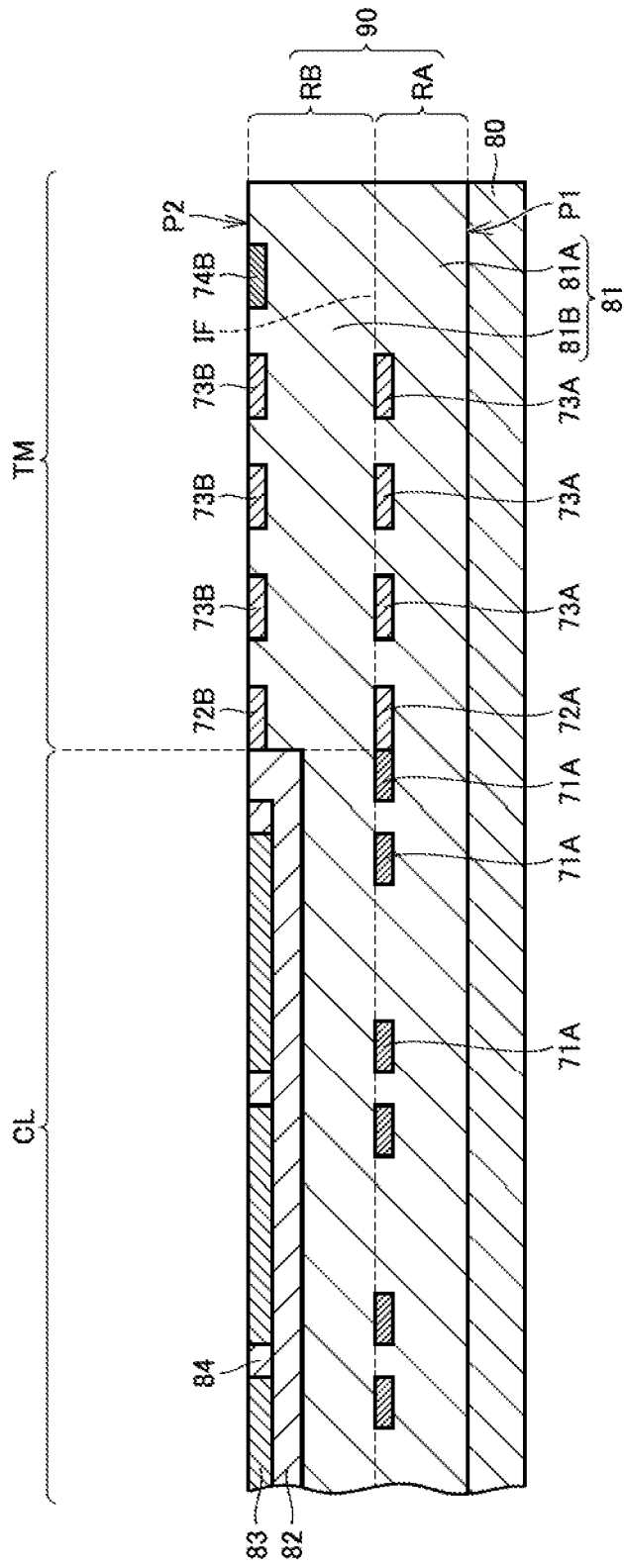
FIG. 7 is a partial cross sectional view schematically showing a fourth step of the method for manufacturing the silicon carbide semiconductor device of FIG. 2.

Next, as shown in FIG. 7, impurity regions are formed by impurity ion implantation into upper surface P2 of epitaxial film 90. Specifically, in element portion CL, base layer 82 is formed on upper drift layer 81B. Moreover, on base layer 82, source region 83 separated from upper drift layer 81B by base layer 82 is formed. Moreover, in element portion CL, contact region 84 is formed to extend from upper surface P2 to base layer 82. Moreover, upper JTE region 72B, upper guard ring region 73B, and field stop region 74B are formed partially at upper surface P2 in termination portion TM. The impurity regions can be formed in any order. In the present embodiment, for formation of the field stop region, an impurity for providing n type, i.e., a donor, is implanted. As the donor, phosphorus can be used, for example.

Next, heat treatment is performed to activate the impurities. This heat treatment is preferably performed at a temperature of not less than 1500° C. and not more than 1900° C., for example, a temperature of approximately 1700° C. The heat treatment is performed for approximately 30 minutes, for example. The atmosphere of the heat treatment is preferably an inert gas atmosphere, such as argon atmosphere.

Figure 8:
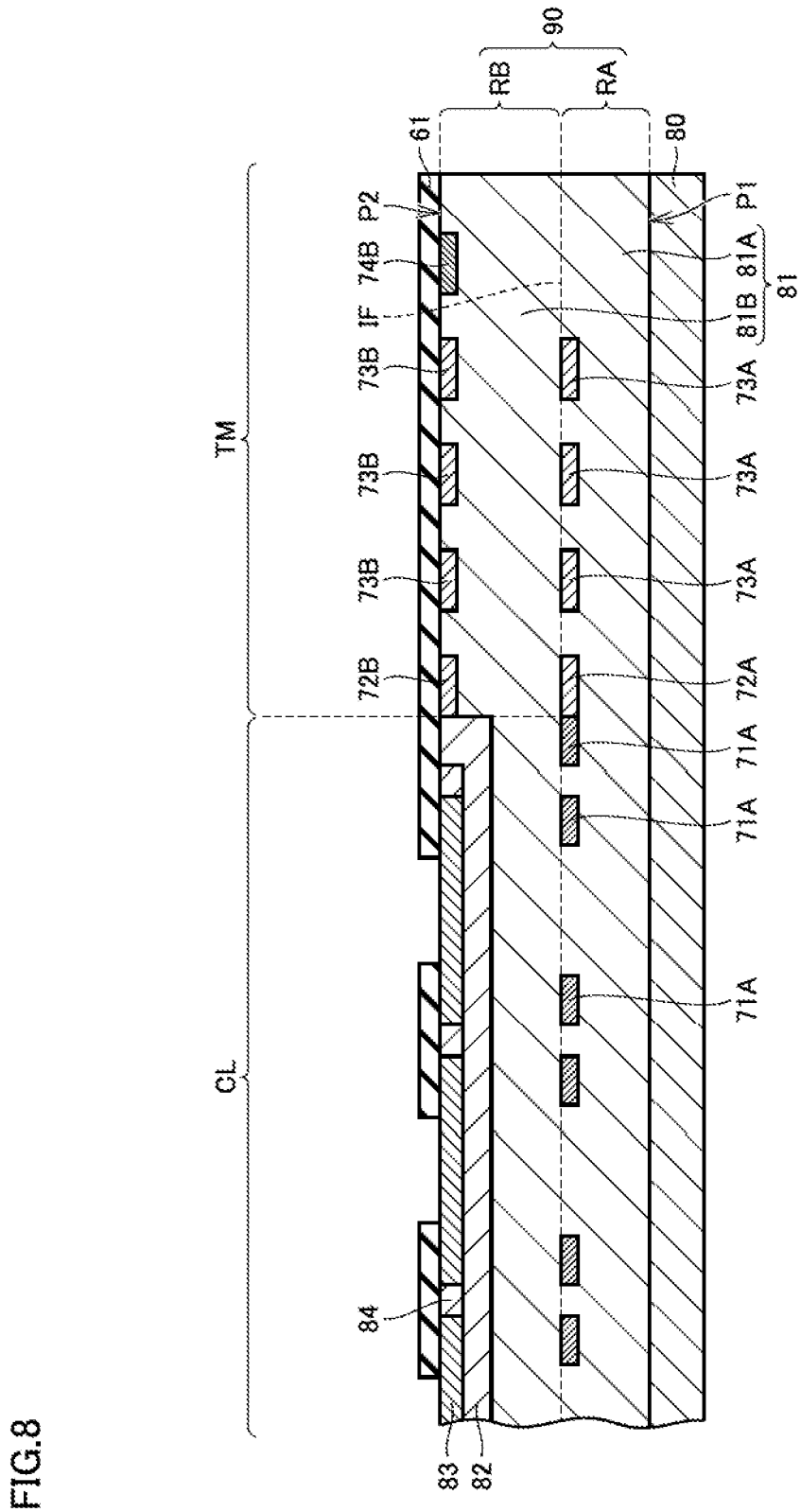
FIG. 8 is a partial cross sectional view schematically showing a fifth step of the method for manufacturing the silicon carbide semiconductor device of FIG. 2.

As shown in FIG. 8, a mask layer 61 having an opening is formed on upper surface P2 of epitaxial film 90. The opening is formed to correspond to the location of trench TR (FIG. 2). Mask layer 61 is preferably made of silicon dioxide, and is more preferably formed by thermal oxidation.

Figure 9:
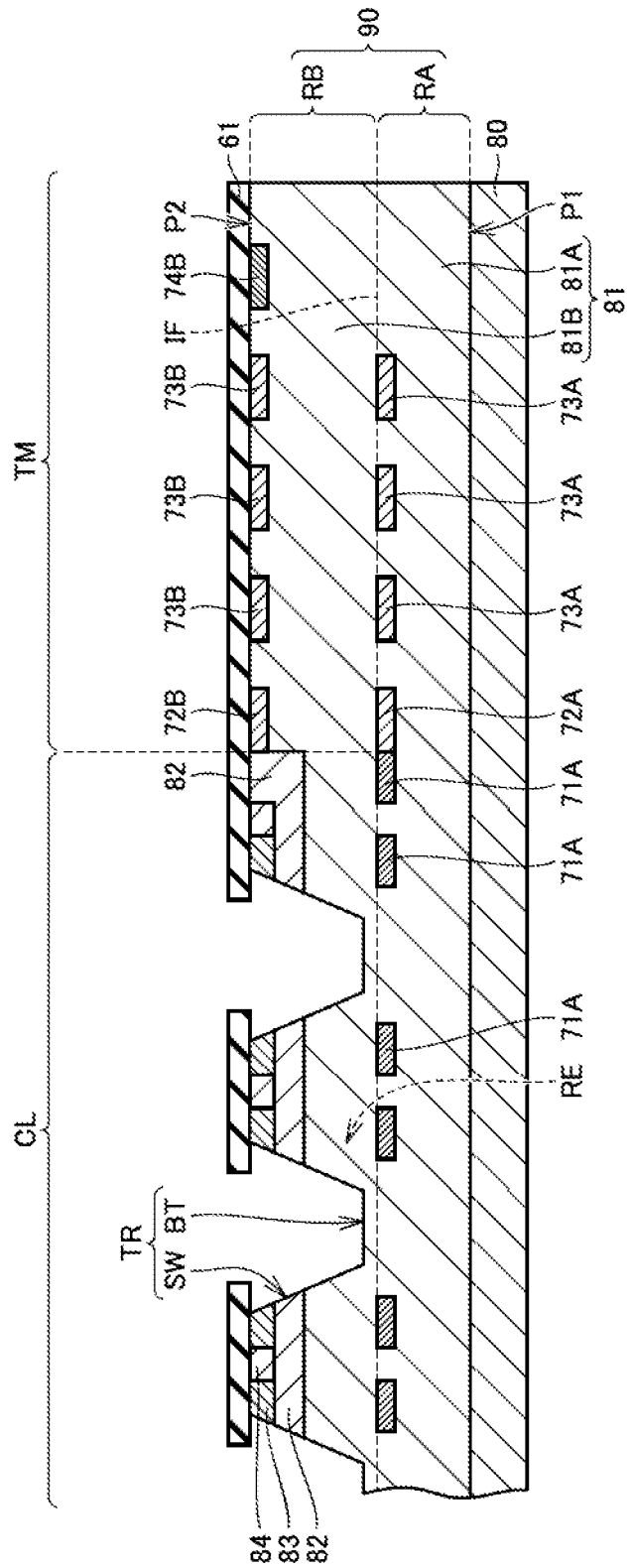
FIG. 9 is a partial cross sectional view schematically showing a sixth step of the method for manufacturing the silicon carbide semiconductor device of FIG. 2.

As shown in FIG. 9, thermal etching employing mask layer 61 is performed. Specifically, reactive gas is supplied to heated epitaxial film 90. The reactive gas can react with silicon carbide under heating and preferably includes a halogen gas, such as chlorine gas. The reactive gas may also include oxygen gas. Moreover, the reactive gas may include carrier gas. Examples of the carrier gas usable herein include nitrogen gas, argon gas, or helium gas. Epitaxial film 90 is heated at, for example, not less than about 700° C. and not more than about 1000° C.

Figure 10:
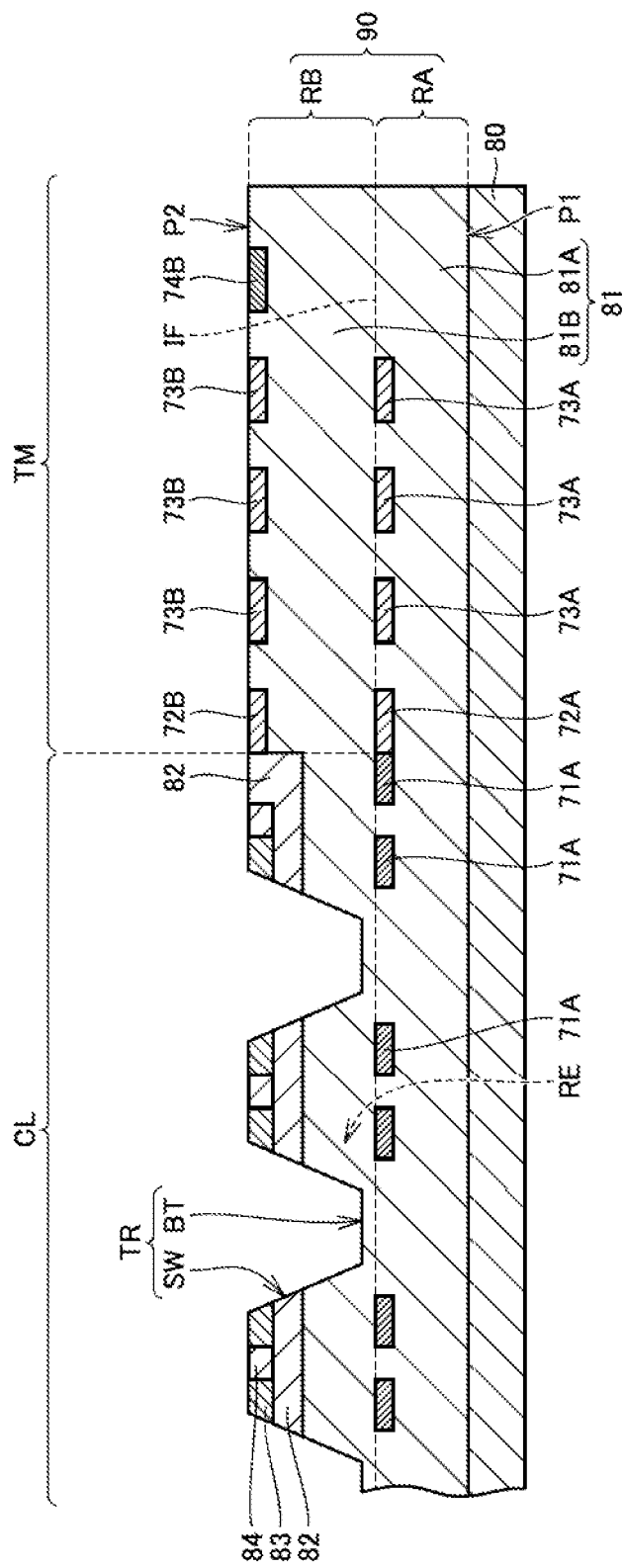
FIG. 10 is a partial cross sectional view schematically showing a seventh step of the method for manufacturing the silicon carbide semiconductor device of FIG. 2.

By this thermal etching, trench TR having side wall surface SW is formed in upper surface P2 of epitaxial film 90. In this thermal etching, silicon carbide is etched at an etching rate of about 70 μm/hour, for example. In this case, if mask layer 61 is made of silicon dioxide, mask layer 61 is significantly suppressed from being consumed. During the formation of trench TR by the thermal etching, a special plane is spontaneously formed on side wall surface SW, in particular, on base layer 82. Next, mask layer 61 is removed by means of an appropriate method such as etching (FIG. 10).

Figure 11:
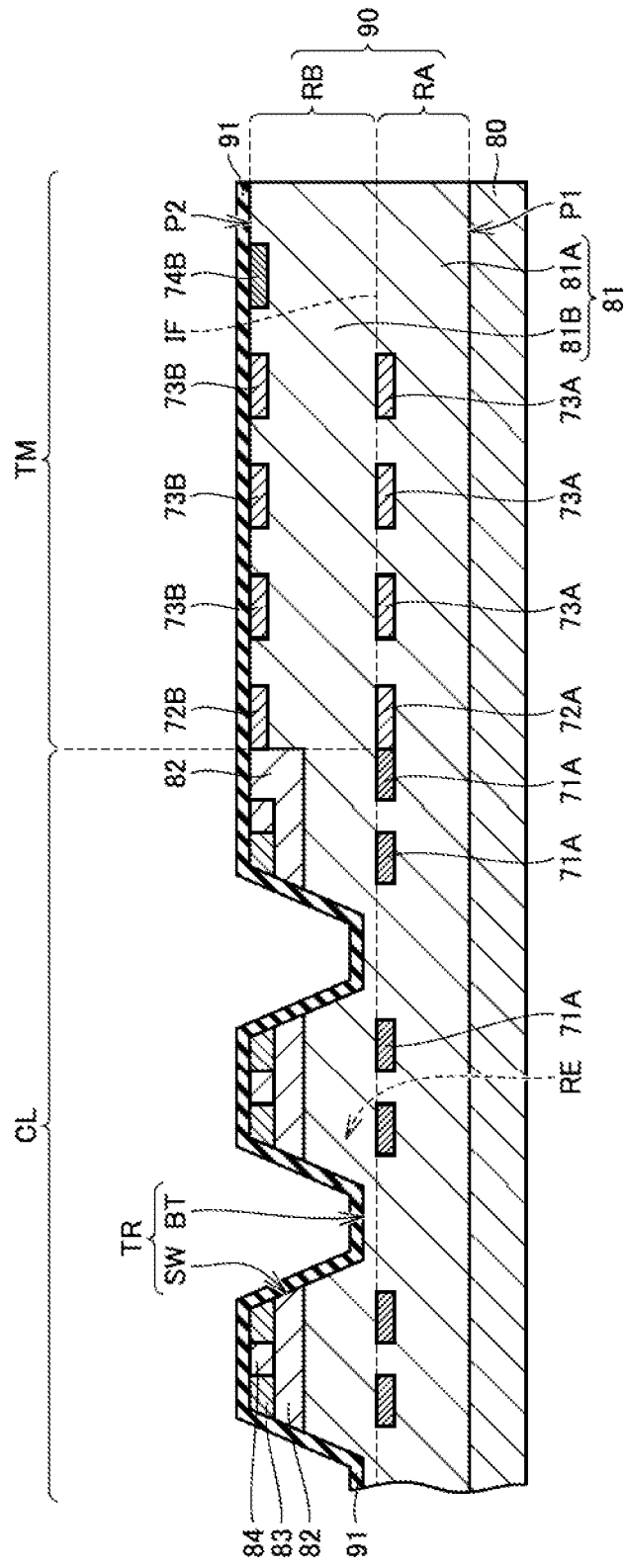
FIG. 11 is a partial cross sectional view schematically showing an eighth step of the method for manufacturing the silicon carbide semiconductor device of FIG. 2.

As shown in FIG. 11, gate oxide film 91 is formed on side wall surface SW and bottom surface BT of trench TR. Gate oxide film 91 has a portion connecting upper drift layer 81B and source region 83 to each other on base layer 82. Gate oxide film 91 is preferably formed by thermal oxidation.

After the formation of gate oxide film 91, NO annealing may be performed using nitrogen monoxide (NO) gas as an atmospheric gas. A temperature profile has such a condition that the temperature is not less than 1100° C. and not more than 1300° C. and holding time is approximately 1 hour, for example. Accordingly, nitrogen atoms are introduced in an interface region between gate oxide film 91 and base layer 82. As a result, formation of interface states in the interface region is suppressed, thereby achieving improved channel mobility. It should be noted that a gas other than the NO gas can be employed as the atmospheric gas as long as the nitrogen atoms can be thus introduced. After this NO annealing, Ar annealing may be further performed using argon (Ar) as an atmospheric gas. The Ar annealing is preferably performed at a heating temperature higher than the heating temperature in the above-described NO annealing and lower than the melting point of gate oxide film 91. This heating temperature is held for approximately 1 hour, for example. Accordingly, formation of interface states in the interface region between gate oxide film 91 and base layer 82 is further suppressed. It should be noted that instead of the Ar gas, an inert gas such as nitrogen gas can be employed as the atmospheric gas.

Figure 12:
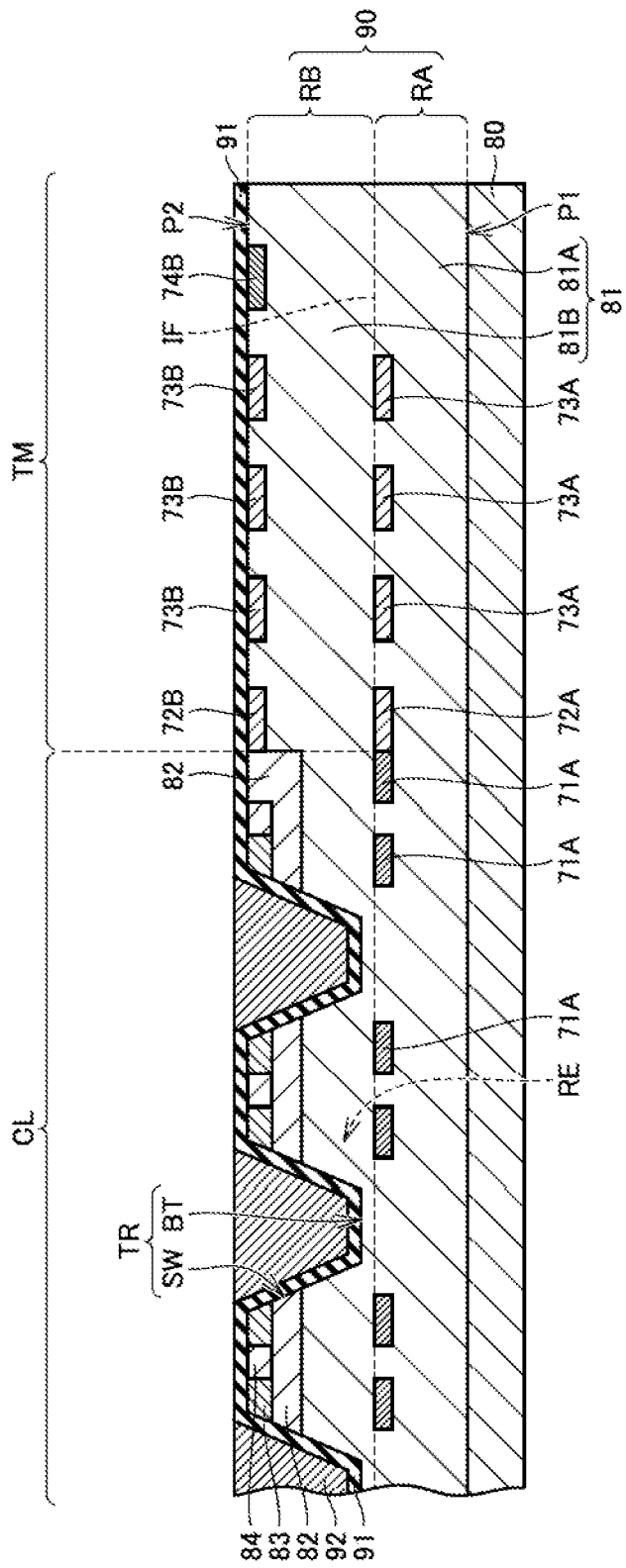
FIG. 12 is a partial cross sectional view schematically showing a ninth step of the method for manufacturing the silicon carbide semiconductor device of FIG. 2.

As shown in FIG. 12, gate electrode 92 is formed on gate oxide film 91. Specifically, gate electrode 92 is formed on gate oxide film 91 so as to fill the region within trench TR with gate oxide film 91 interposed therebetween. A method for forming gate electrode 92 can be performed by, for example, forming a film of conductor or doped silicon and performing CMP (Chemical Mechanical Polishing).

Figure 13:
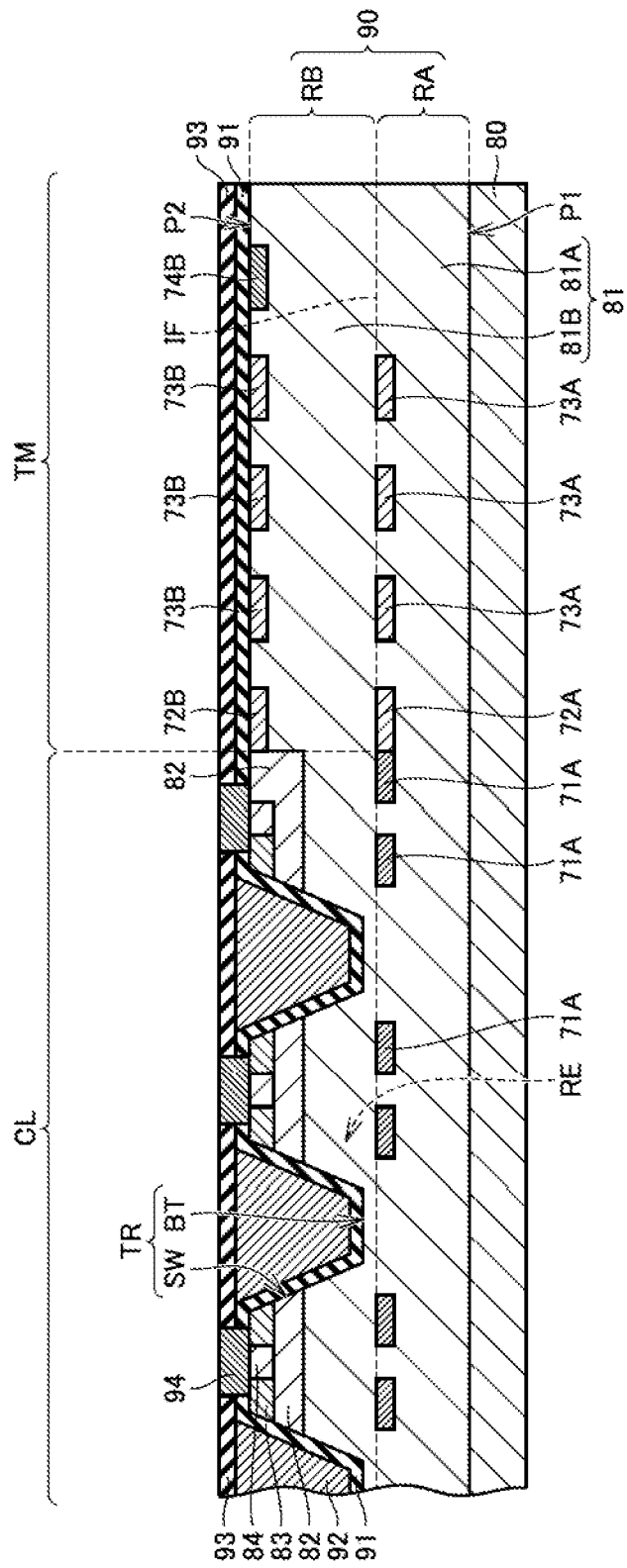
FIG. 13 is a partial cross sectional view schematically showing a tenth step of the method for manufacturing the silicon carbide semiconductor device of FIG. 2.

Referring to FIG. 13, interlayer insulating film 93 is formed on gate electrode 92 and gate oxide film 91 so as to cover the exposed surface of gate electrode 92. Etching is performed to form an opening in interlayer insulating film 93 and gate oxide film 91. Through the opening, each of source region 83 and contact region 84 is exposed on upper surface P2. Next, on upper surface P2, source electrode 94 is formed in contact with each of source region 83 and n contact region 84.

With reference to FIG. 2 again, drain electrode 98 is formed on lower drift layer 81A with single-crystal substrate 80 interposed therebetween. Source interconnection layer 95 is formed. In this way, MOSFET 200 is obtained.

(Thermal Etching)

The thermal etching is performed by subjecting an object, to be etched, to an etching gas under a high temperature, and has substantially no physical etching function. A process gas for the thermal etching contains a halogen element. More preferably, the halogen element is chlorine or fluorine. Specifically, an exemplary, usable process gas is a process gas containing at least one of $Cl_2$, $BCl_3$, $CF_4$, and $SF_6$, and $Cl_2$ can be used particularly suitably.

Moreover, the process gas preferably further contains oxygen gas. Further, the process gas may contain a carrier gas. Examples of the carrier gas include nitrogen gas, argon gas, or helium gas.

Preferably, the heat treatment temperature of the thermal etching is not less than 700° C. and not more than 1200° C. The lower limit of this temperature is more preferably 800° C., further preferably 900° C. Accordingly, the etching rate can attain a sufficiently practical value. Further, the upper limit of this temperature is more preferably 1100° C., further preferably 1000° C. When the heat treatment temperature is set at not less than 700° C. and not more than 1000° C., a rate of etching SiC is approximately, for example, 70 μm/hr.

By using the thermal etching, side wall surface SW can be spontaneously formed into a special plane. Accordingly, the resistance of the channel formed in side wall surface SW can be made small.

(Function and Effect of the Present Embodiment)

According to the present embodiment, silicon carbide is used as a material of epitaxial film 90 of MOSFET 200. Accordingly, MOSFET 200 can handle a high voltage with which drift region 81 is fed with a maximum electric field of 0.4 MV/cm or more.

Further, MOSFET 200 is configured such that under the application of the voltage described above, the maximum electric field strength in upper range RB within element portion CL (region indicated by arrow RE of FIG. 2) becomes less than ⅔ of the maximum electric field strength in lower range RA. Accordingly, electric field strength in upper range RB within element portion CL, which serves as a determination factor for breakdown voltage, is made lower. Specifically, at the corner portion formed by side wall surface SW and bottom surface BT of trench TR, the electric field strength applied to gate oxide film 91 is made lower. Conversely, when the maximum electric field strength in lower range RA exceeds an electric field strength 1.5 times as large as the maximum electric field strength in upper range RB within element portion CL, the maximum electric field strength in lower range RA, which does not serve as the determination factor for breakdown voltage, is made higher. Accordingly, high voltage can be applied to MOSFET 200. In other words, the breakdown voltage can be increased.

Upper range RB has upper JTE region 72B, upper guard ring region 73B, and field stop region 74B. Accordingly, the breakdown voltage can be increased more. It should be noted that part or whole of these configurations may be omitted.

(Modification)

Figure 14:
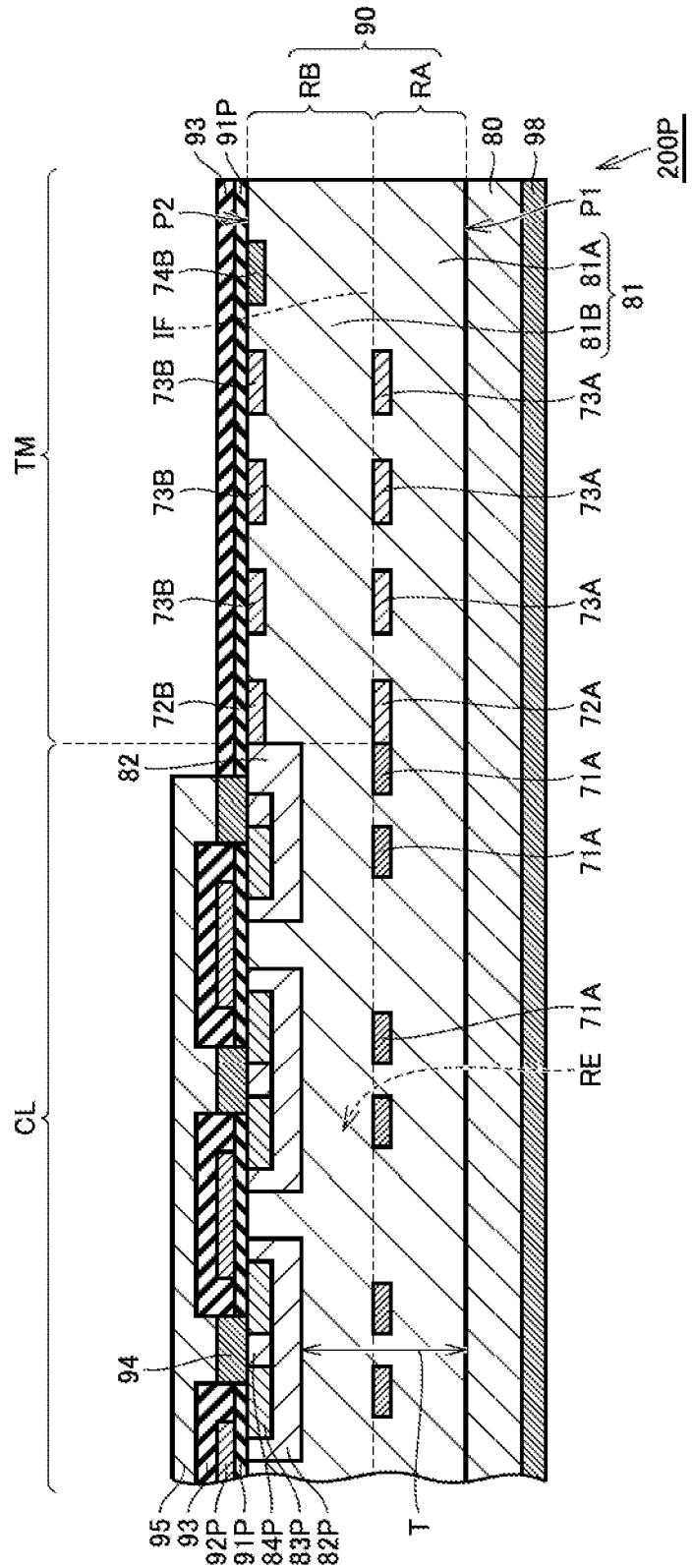
FIG. 14 is a partial cross sectional view schematically showing a configuration of a silicon carbide semiconductor device in a modification of FIG. 2.

As shown in FIG. 14, a MOSFET 200P, which is a modification of MOSFET 200 (FIG. 2), is a planer type. Specifically, no trench TR (FIG. 2) is provided in upper surface P2 of epitaxial film 90, and impurity regions, such as a base layer 82P, a source region 83P, and a contact region 84P, are formed on flat P2. Moreover, a gate oxide film 91P is provided on flat P2, and gate electrode 92P is provided thereon.

According to the present modification, strength of electric field applied to a boundary between base layer 82P and upper drift layer 81B is made lower, the strength of electric field being likely to be a determination factor for breakdown voltage in a planer type MOSFET. Accordingly, the breakdown voltage of MOSFET 200P can be increased.

(Configuration of Special Plane)

The following fully describes the "special plane" described above. As described above, side wall surface SW (FIG. 2) of trench TR preferably has a special plane particularly on base layer 82. The following describes a case where side wall surface SW has a special plane.

Figure 15:
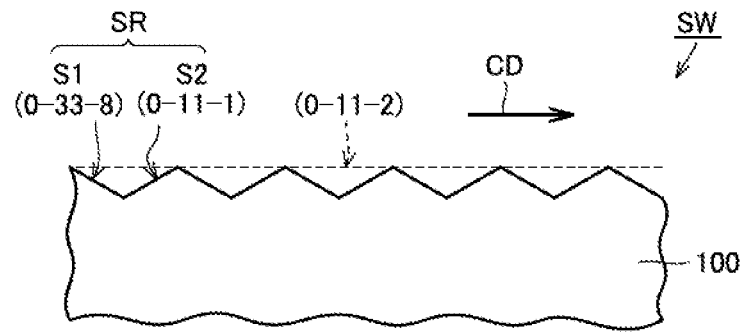
FIG. 15 is a partial cross sectional view schematically showing a fine structure in a surface of the silicon carbide film included in the silicon carbide semiconductor device.

As shown in FIG. 15, side wall surface SW having the special plane has a plane S1 (first plane). Plane S1 has a plane orientation of {0-33-8}, and preferably has a plane orientation of (0-33-8). Preferably, side wall surface SW microscopically includes plane S1. Preferably, side wall surface SW further microscopically includes a plane S2 (second plane). Plane S2 has a plane orientation of {0-11-1}, and preferably has a plane orientation of (0-11-1). Here, the term "microscopically" refers to "minutely to such an extent that at least the size about twice as large as an interatomic spacing is considered". As a method for observing such a microscopic structure, for example, a TEM (Transmission Electron Microscope) can be used.

Preferably, side wall surface SW has a combined plane SR. Combined plane SR is formed of periodically repeated planes S1 and S2. Such a periodic structure can be observed by, for example, TEM or AFM (Atomic Force Microscopy). Combined plane SR has a plane orientation of {0-11-2}, and preferably has a plane orientation of (0-11-2). In this case, combined plane SR has an off angle of 62° relative to the {000-1} plane, macroscopically. Here, the term "macroscopically" refers to "disregarding a fine structure having a size of approximately interatomic spacing". For the measurement of such a macroscopic off angle, a method employing general X-ray diffraction can be used, for example. Preferably, in a channel surface, carriers flow in a channel direction CD, in which the above-described periodic repetition is done.

Next, a detailed structure of combined plane SR will be illustrated.

Figure 16:
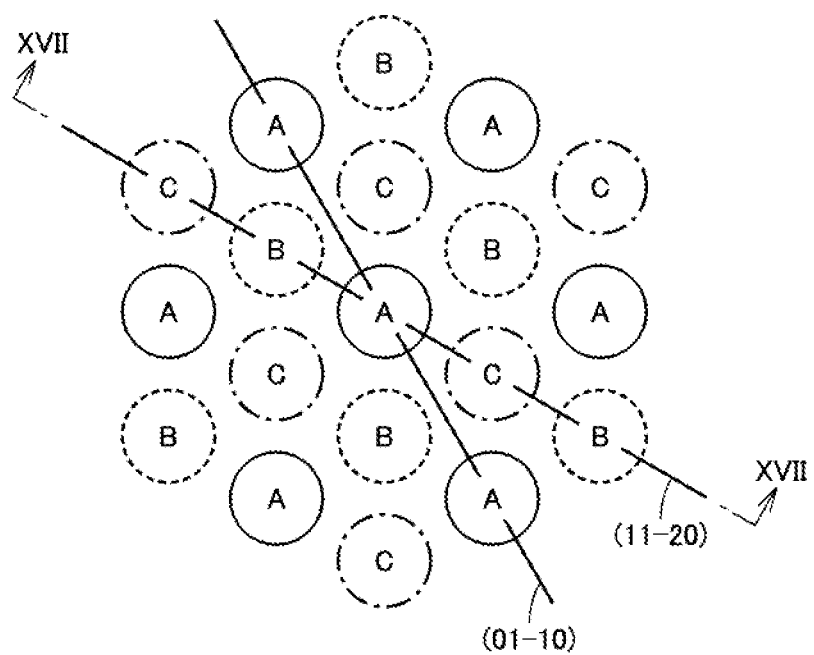
FIG. 16 shows a crystal structure of a (000-1) plane in a hexagonal crystal of polytype 4H.

Generally, regarding Si atoms (or C atoms), when viewing a silicon carbide single-crystal of polytype 4H from the (000-1) plane, atoms in a layer A (solid line in the figure), atoms in a layer B (broken line in the figure) disposed therebelow, and atoms in a layer C (chain line in the figure) disposed therebelow, and atoms in a layer B (not shown in the figure) disposed therebelow are repeatedly provided as shown in FIG. 16. In other words, with four layers ABCB being regarded as one period, a periodic stacking structure such as ABCBAB-CBABCB . . . is provided.

Figure 17:
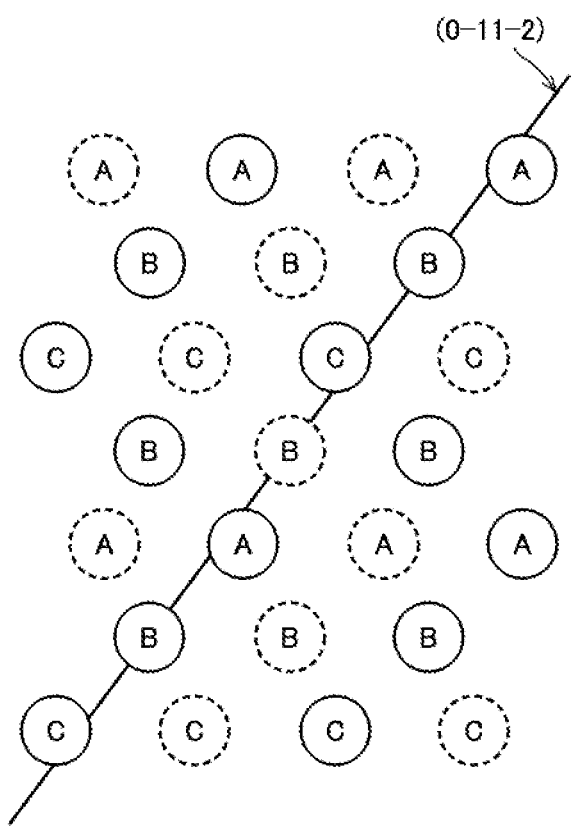
FIG. 17 shows a crystal structure of a (11-20) plane along a line XVII-XVII of FIG. 16.

As shown in FIG. 17, in the (11-20) plane (cross section taken along a line XVII-XVII of FIG. 16), atoms in each of four layers ABCB constituting the above-described one period are not aligned completely along the (0-11-2) plane. In FIG. 17, the (0-11-2) plane is illustrated to pass through the locations of the atoms in layers B. In this case, it is understood that each of atoms in layers A and C is deviated from the (0-11-2) plane. Hence, even when the macroscopic plane orientation of the surface of the silicon carbide single-crystal, i.e., the plane orientation thereof with its atomic level structure being ignored is limited to (0-11-2), this surface can have various structures microscopically.

Figure 18:
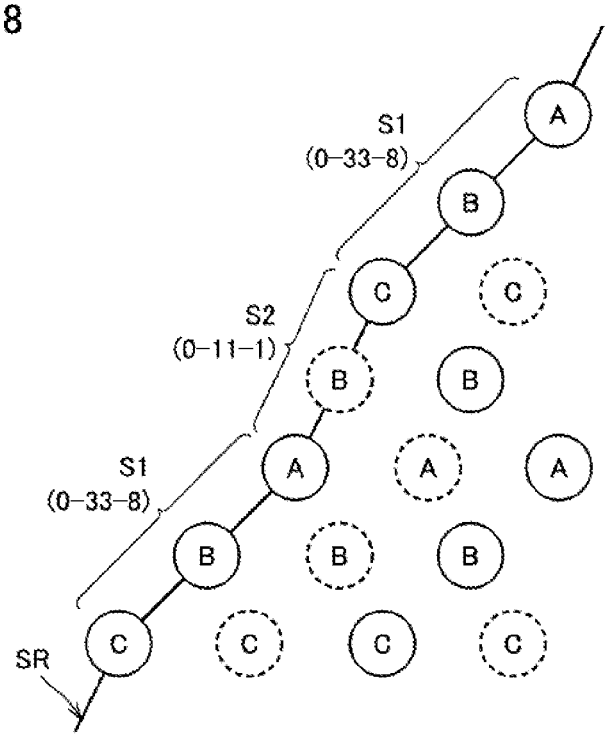
FIG. 18 shows a crystal structure in the vicinity of a surface with a combined plane of FIG. 15 within a (11-20) plane.

As shown in FIG. 18, combined plane SR is constructed by alternately providing planes S1 having a plane orientation of (0-33-8) and planes S2 connected to planes S1 and having a plane orientation different from that of each of planes S1. Each of planes S1 and S2 has a length twice as large as the interatomic spacing of the Si atoms (or C atoms) It should be noted that a plane with plane S1 and plane S2 being averaged corresponds to the (0-11-2) plane (FIG. 17).

Figure 19:
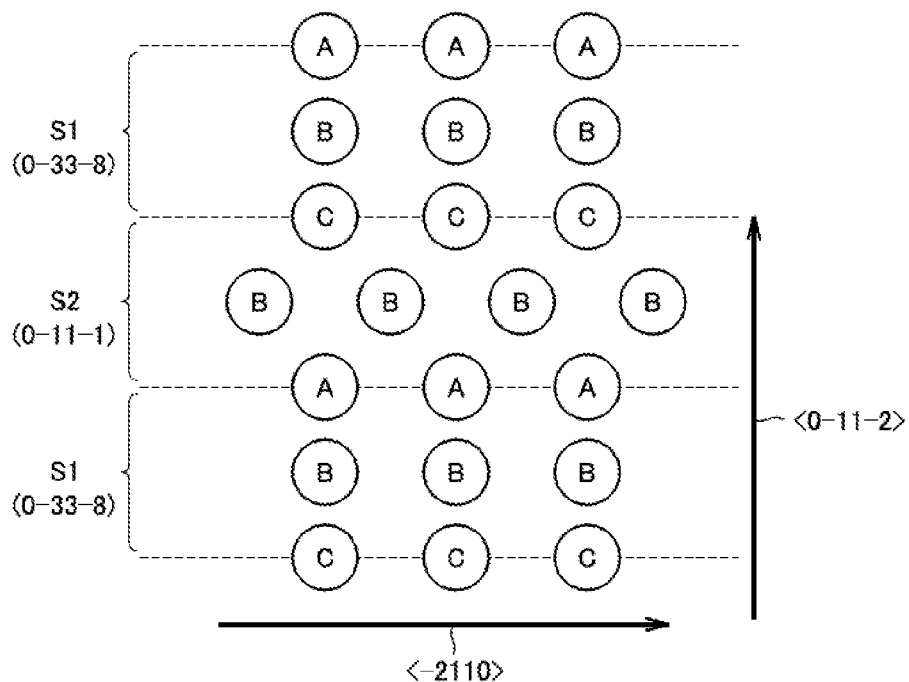
FIG. 19 shows the combined plane of FIG. 15 when viewed from a (01-10) plane.

As shown in FIG. 19, when viewing combined plane SR from the (01-10) plane, the single-crystal structure has a portion periodically including a structure (plane S1 portion) equivalent to a cubic structure. Specifically, combined plane SR is constructed by alternately providing planes S1 having a plane orientation of (001) in the above-described structure equivalent to the cubic structure and planes S2 connected to planes S1 and having a plane orientation different from that of each of planes S1. Also in a polytype other than polytype 4H, the surface can be thus constituted of the planes (planes S1 in FIG. 19) having a plane orientation of (001) in the structure equivalent to the cubic structure and the planes (planes S2 in FIG. 19) connected to the foregoing planes and having a plane orientation different from that of each of the foregoing planes. The polytype may be 6H or 15R, for example.

Figure 20:
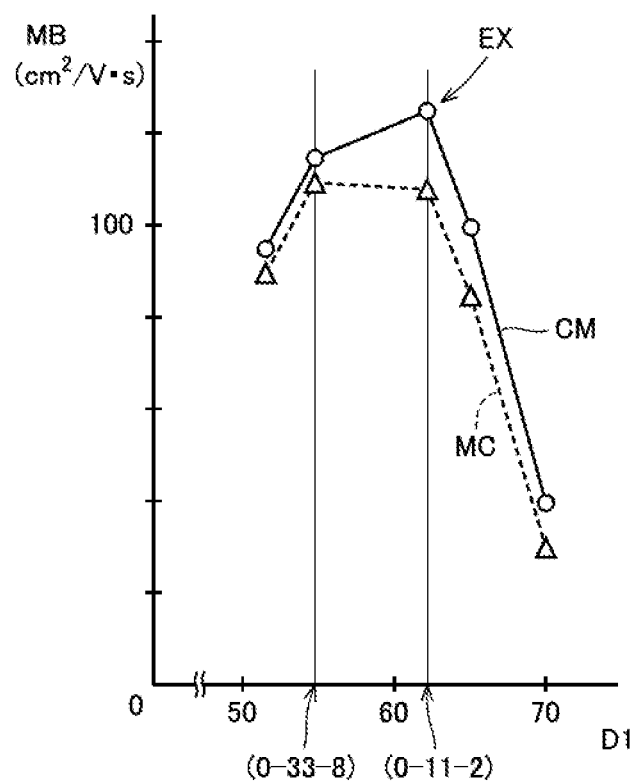
FIG. 20 is a graph showing an exemplary relation between channel mobility and an angle between a channel surface and the (000-1) plane when macroscopically viewed, in each of a case where thermal etching is performed and a case where no thermal etching is performed.

Next, with reference to FIG. 20, the following describes a relation between the crystal plane of side wall surface SW and mobility MB of the channel surface. In the graph of FIG. 20, the horizontal axis represents an angle D1 formed by the (000-1) plane and the macroscopic plane orientation of side wall surface SW having the channel surface, whereas the vertical axis represents mobility MB. A group of plots CM correspond to a case where side wall surface SW is finished to correspond to a special plane by thermal etching, whereas a group of plots MC correspond to a case where side wall SW is not thermally etched.

In group of plots MC, mobility MB is at maximum when the channel surface has a macroscopic plane orientation of (0-33-8). This is presumably due to the following reason. That is, in the case where the thermal etching is not performed, i.e., in the case where the microscopic structure of the channel surface is not particularly controlled, the macroscopic plane orientation thereof corresponds to (0-33-8), with the result that a ratio of the microscopic plane orientation of (0-33-8), i.e., the plane orientation of (0-33-8) in consideration of that in atomic level becomes statistically high.

On the other hand, mobility MB in group of plots CM is at maximum when the macroscopic plane orientation of the channel surface is (0-11-2) (arrow EX). This is presumably due to the following reason. That is, as shown in FIG. 18 and FIG. 19, the multiplicity of planes S1 each having a plane orientation of (0-33-8) are densely and regularly arranged with planes S2 interposed therebetween, whereby a ratio of the microscopic plane orientation of (0-33-8) becomes high in the channel surface.

Figure 21:
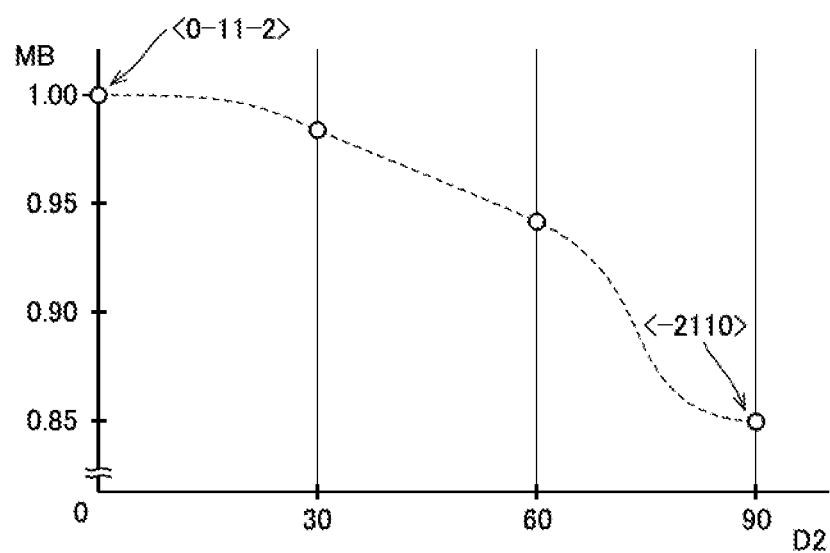
FIG. 21 is a graph showing an exemplary relation between the channel mobility and an angle between a channel direction and a <0-11-2> direction.

It should be noted that mobility MB has orientation dependency on combined plane SR. In a graph shown in FIG. 21, the horizontal axis represents an angle D2 between the channel direction and the <0-11-2> direction, whereas the vertical axis represents mobility MB (in any unit) in the channel surface. A broken line is supplementarily provided therein for viewability of the graph. From this graph, it has been found that in order to increase channel mobility MB, channel direction CD (FIG. 15) preferably has an angle D2 of not less than 0° and not more than 60°, more preferably, substantially 0°.

Figure 22:
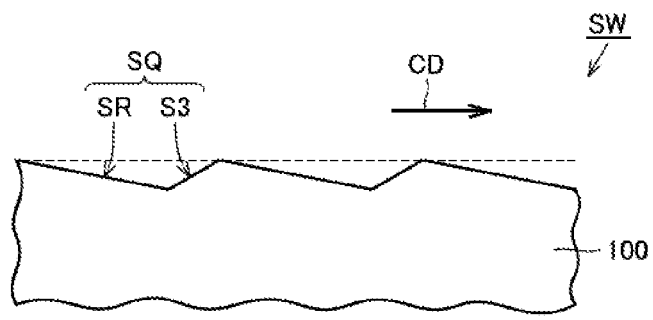
FIG. 22 shows a modification of FIG. 15.

As shown in FIG. 22, side wall surface SW may further include a plane S3 (third plane) in addition to combined plane SR (illustrated in a simplified manner by a straight line in FIG. 22). In this case, the off angle of side wall surface SW relative to the {000-1} plane is deviated from the ideal off angle of combined plane SR, i.e., 62°. Preferably, this deviation is small, preferably, in a range of ±10°. Examples of a surface included in such an angle range include a surface having a macroscopic plane orientation of the {0-33-8} plane. More preferably, the off angle of side wall surface SW relative to the (000-1) plane is deviated from the ideal off angle of combined plane SR, i.e., 62°. Preferably, this deviation is small, preferably, in a range of ±10°. Examples of a surface included in such an angle range include a surface having a macroscopic plane orientation of the (0-33-8) plane.

More specifically, side wall surface SW may include a combined plane SQ constituted of periodically repeated plane S3 and combined plane SR. Such a periodic structure can be observed by, for example, TEM or AFM (Atomic Force Microscopy).

(Silicon Carbide Semiconductor Device Having Special Plane)

When side wall surface SW (FIG. 2) of trench TR includes plane S1 (FIG. 15), a channel is formed in a plane having a plane orientation of {0-33-8}. Accordingly, part of on-resistance contributed by channel resistance is suppressed. Therefore, while maintaining the on-resistance to be equal to or less than a predetermined value, resistance by drift region 81 can be increased. Therefore, the impurity concentration of drift region 81 can be made lower. Therefore, the breakdown voltage of MOSFET 200 can be increased more. When side wall surface SW of trench TR microscopically includes plane S1 and plane S2, the on-resistance can be further suppressed. Accordingly, the breakdown voltage can be more increased. When planes S1 and S2 of side wall surface SW constitutes combined plane SR, the on-resistance can be further suppressed. Accordingly, the breakdown voltage can be more increased.

EXAMPLES

Table 1 below shows results of simulation for Examples 1 and 2 and a Comparative Example with regard to MOSFET 200 (FIG. 2).

TABLE 1

| | Comparative Example | Example 1 | Example 2 |
|---|---|---|---|
| Impurity Dose Amount | $1 \times 10^{13}$ (cm$^{-2}$) | $3 \times 10^{13}$ (cm$^{-2}$) | $5 \times 10^{13}$ (cm$^{-2}$) |
| Voltage with which Gate Oxide Film is Broken | 656 (V) | 1288 (V) | 1543 (V) |
| Voltage with which Charge Compensation Region is Broken | 2500 (V) | 1540 (V) | 1450 (V) |
| Breakdown Voltage | 656 (V) | 1288 (V) | 1450 (V) |

In Table 1, the "Impurity Dose Amount" represents the impurity dose amount of charge compensation region 71A. From this result, it is found that by increasing the impurity dose amount, the determination factor for breakdown voltage is changed from the breakage phenomenon of gate oxide film 91 to the breakage phenomenon of the charge compensation region. Moreover, it is found that the breakdown voltage of MOSFET 200 can be increased.

Figure 23:
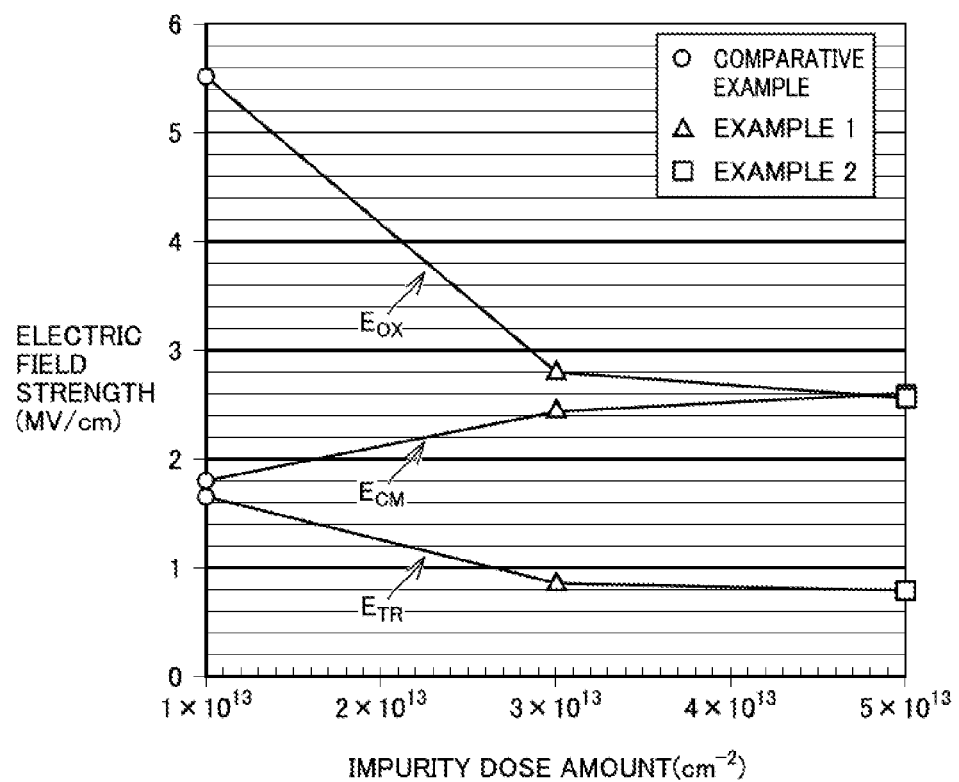
FIG. 23 is a graph illustrating a relation between an impurity dose amount of a charge compensation region and electric field strength.

With reference to FIG. 23, gate oxide film 91 is prevented from being broken as described above because electric field strength $E_{OX}$ applied to gate oxide film 91 is decreased. The decrease of electric field strength $E_{OX}$ corresponds to the decrease of electric field strength $E_{TR}$, which is the maximum electric field strength in upper range RB, in trench TR. In contrast, electric field strength $E_{CM}$, which is the maximum electric field strength in lower range RA, in charge compensation region 71A is increased according to increase of the impurity dose amount.

In the Comparative Example, electric field strength $E_{TR}$ serving as the maximum electric field strength in upper range RB and electric field strength $E_{CM}$ serving as the maximum electric field strength in lower range RA are almost the same. The breakdown voltage in this case is 656 V, thus failing to provide improvement of breakdown voltage by sufficiently employing the advantage of the physical properties of SiC.

In Example 1, electric field strength $E_{TR}$ serving as the maximum electric field strength in upper range RB is less than the half of electric field strength $E_{CM}$ serving as the maximum electric field strength in lower range RA. The breakdown voltage in this case is 1288 V, thus achieving improvement of breakdown voltage by employing the advantage of the physical properties of SiC.

In Example 2, the breakdown voltage is further improved. In Example 2, as shown in Table 1, the determination factor for breakdown voltage is the breakage phenomenon of gate oxide film 91. Hence, it is considered that if the impurity dose amount is increased further, the breakdown voltage will be decreased.

In view of the results of the Comparative Example and Example 1, it is considered that the breakdown voltage can be also increased as compared with the breakdown voltage in the Comparative Example by means of a configuration substantially intermediate between these configurations, i.e., a configuration in which electric field strength $E_{TR}$ serving as the maximum electric field strength in upper range RB is less than about ⅔ of electric field strength $E_{CM}$ serving as the maximum electric field strength in lower range RA.

It should be noted that the electric field strength shown in FIG. 23 was calculated with a voltage between source electrode 94 and drain electrode 92 being 1200 V. Moreover, the opening width of trench TR was set at 3.0 μm and the depth thereof was set at 1.4 μm. Moreover, charge compensation region 71A was disposed at a depth of 3 μm from upper surface P2 in the thickness direction, and was disposed in a range of 1 to 3 μm from the central location of the mesa structure in the in-plane direction (lateral direction of FIG. 2). Moreover, lower drift layer 81A was set to have a thickness of 12 μm and have an impurity concentration of $4 \times 10^{15}$ cm$^{-3}$. Moreover, upper drift layer 81B was set to have a thickness of 3 μm and have an impurity concentration of $7.5 \times 10^{15}$ cm$^{-3}$.

Figure 24:
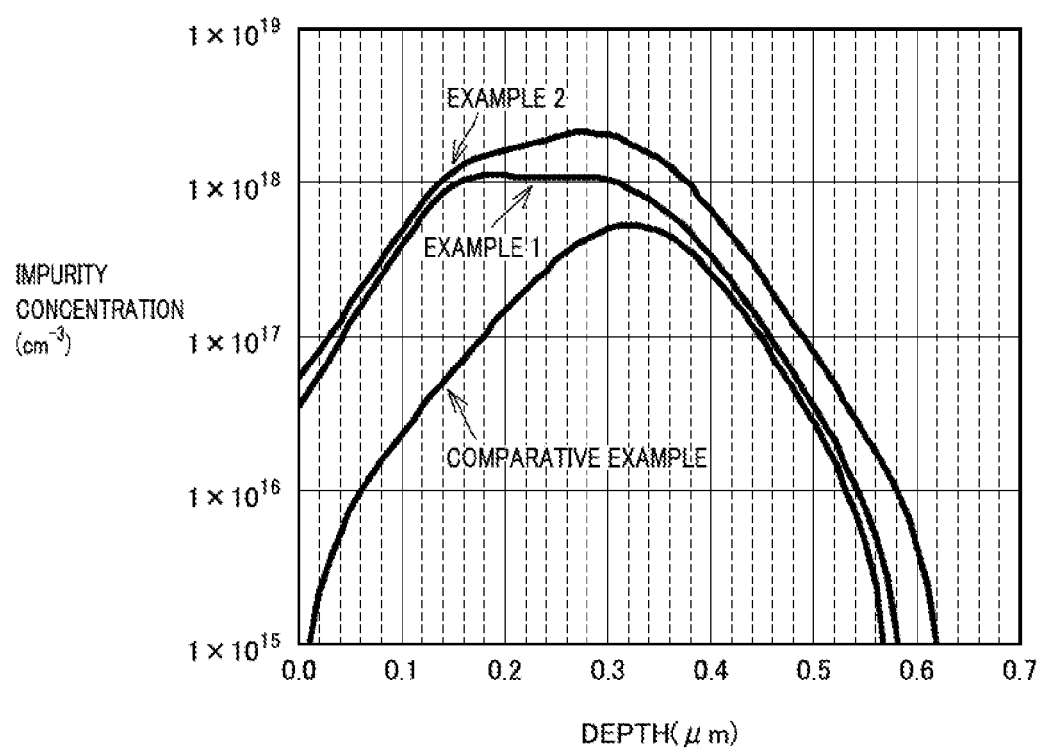
FIG. 24 is a graph illustrating an impurity concentration profile of the charge compensation region.

Moreover, charge compensation region 71A was obtained by implantation of Al in the impurity concentration profile of FIG. 24. The concentration profile of the Comparative Example was obtained by performing implantation once with a dose amount of $1 \times 10^{13}$ cm$^{-2}$ and with an accelerating energy of 300 keV. The concentration profile of Example 1 was obtained by performing implantation with a dose amount of $1 \times 10^{13}$ cm$^{-2}$ and with an accelerating energy of 300 keV and performing implantation with a dose amount of $2 \times 10^{13}$ cm$^{-2}$ and with an accelerating energy of 240 keV. The concentration profile of Example 2 was obtained by performing implantation with a dose amount $2 \times 10^{13}$ cm$^{-2}$ and with an accelerating energy of 300 keV, performing implantation with a dose amount of $2 \times 10^{13}$ cm$^{-2}$ and with an accelerating energy of 240 keV, and performing implantation with a dose amount of $1 \times 10^{13}$ cm$^{-2}$ and with an accelerating energy of 150 keV.

APPENDIX

The channel type of the silicon carbide semiconductor device may be p channel type, and in this case, there can be employed a configuration in which p type and n type were replaced with each other in the above-described embodiment. Further, the silicon carbide semiconductor device may be a MISFET (Metal Insulator Semiconductor Field Effect Transistor) other than the MOSFET, and may be a silicon carbide semiconductor device other than the MISFET. Examples of the silicon carbide semiconductor device other than the MISFET include an IGBT (Insulated Gate Bipolar Transistor).

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

71A: charge compensation region; 72A: embedded JTE region (first junction terminal region); 72B: upper JTE region (second junction terminal region); 73A: embedded guard ring region (first guard ring region); 73B: upper guard ring region (second guard ring region); 74B: field stop region; 80: single-crystal substrate (substrate); 81: drift region (breakdown voltage holding region); 81A: lower drift layer (first breakdown voltage holding layer); 81B: upper drift layer (second breakdown voltage holding layer); 82, 82P: base layer (channel forming region); 83, 83P: source region; 84, 84P: contact region; 90: epitaxial film (silicon carbide film); 91, 91P: gate oxide film (gate insulating film); 92, 92P: gate electrode; 94: source electrode (second main electrode); 98: drain electrode (first main electrode); 200, 200P: MOSFET (silicon carbide semiconductor device); CL: element portion; IF: interface; P1: lower surface (first main surface); P2: upper surface (second main surface); RA: lower range (first range); RB: upper range (second range); S1: plane (first plane); SQ, SR: combined plane; SW: side wall surface; TM: portion; TR: trench.

The invention claimed is:

1. A silicon carbide semiconductor device including an element portion provided with a semiconductor element and a termination portion surrounding said element portion, the silicon carbide semiconductor device comprising:

a silicon carbide film having a first main surface and a second main surface opposite to said first main surface, said silicon carbide film having a first range and a second range, said first range constituting said first main surface, said second range constituting said second main surface, said first and second ranges having an interface separated from said first and second main surfaces between said first and second ranges, said first range including a first breakdown voltage holding layer, a charge compensation region, a first junction terminal region, and a first guard ring region, said first breakdown voltage holding layer constituting said first main surface and having a first conductivity type, said charge compensation region being partially provided in said element portion at said interface and having a second conductivity type, said first junction terminal region being partially provided in said termination portion at said interface, said first junction terminal region being in contact with said charge compensation region, said first junction terminal region surrounding said element portion, said first junction terminal region having said second conductivity type, said first junction terminal region having an impurity concentration lower than an impurity concentration of said charge compensation region, said first guard ring region being provided to be separated from said first junction terminal region in said termination portion at said interface, said first guard ring region surrounding said element portion at said interface, said first guard ring region having said second conductivity type, said second range including a second breakdown voltage holding layer, a channel forming region, and a source region, said second breakdown voltage holding layer constituting said interface and having said first conductivity type, said channel forming region being provided in said element portion at said second breakdown voltage holding layer and having said second conductivity type, said source region being provided on said channel forming region, said source region being separated from said second breakdown voltage holding layer by said channel forming region, said source region having said first conductivity type, said first and second breakdown voltage holding layers constituting a breakdown voltage holding region in said element portion;

a gate insulating film having a portion connecting said second breakdown voltage holding layer and said source region to each other on said channel forming region;

a gate electrode for switching between an ON state and an OFF state of the silicon carbide semiconductor device, said gate electrode being provided on said gate insulating film;

a first main electrode facing said first main surface; and a second main electrode in contact with said source region on said second main surface, when voltage is applied between said first and second main electrodes to attain a maximum electric field strength of 0.4 MV/cm or more in said breakdown voltage holding region during said OFF state, a maximum electric field strength in said second range within said element portion being configured to be less than ⅔ of a maximum electric field strength in said first range.

2. The silicon carbide semiconductor device according to claim 1, wherein said second range includes a second junction terminal region and a second guard ring region, said second junction terminal region being partially provided in said termination portion at said second main surface, said second junction terminal region being in contact with said channel forming region, said second junction terminal region surrounding said element portion, said second junction terminal region having said second conductivity type, said second junction terminal region having an impurity concentration lower than an impurity concentration of said channel forming region, said second guard ring region being provided to be separated from said second junction terminal region in said termination portion at said second main surface, said second guard ring region surrounding said element portion at said second main surface, said second guard ring region having said second conductivity type.

3. The silicon carbide semiconductor device according to claim 1, wherein said silicon carbide film has a trench, said trench has a side wall surface including a portion constituted of said channel forming region, and said gate electrode is disposed on said side wall surface with said gate insulating film being interposed therebetween.

4. The silicon carbide semiconductor device according to claim 3, wherein said side wall surface of said trench includes a first plane having a plane orientation of {0-33-8}.

5. The silicon carbide semiconductor device according to claim 4, wherein said side wall surface of said trench microscopically includes said first plane, and said side wall surface microscopically further includes a second plane having a plane orientation of {0-11-1}.

6. The silicon carbide semiconductor device according to claim 5, wherein said first and second planes of said side wall surface of said trench constitutes a combined plane having a plane orientation of {0-11-2}.

7. A method for manufacturing a silicon carbide semiconductor device including an element portion provided with a semiconductor element and a termination portion surrounding said element portion, the silicon carbide semiconductor device having a silicon carbide film having a first main surface and a second main surface opposite to said first main surface, said silicon carbide film having a first range and a second range, said first range constituting said first main surface, said second range constituting said second main surface, said first and second ranges having an interface separated from said first and second main surfaces between said first and second ranges, the method comprising the steps of:

forming said first range on a substrate, the step of forming said first range including the step of forming a first breakdown voltage holding layer and the step of forming a charge compensation region, a first junction terminal region, and a first guard ring region after the step of forming said first breakdown voltage holding layer, said first breakdown voltage holding layer constituting said first main surface and having a first conductivity type, said charge compensation region being partially provided in said element portion at said interface and having a second conductivity type, said first junction terminal region being partially provided in said termination portion at said interface, said first junction terminal region being in contact with said charge compensation region, said first junction terminal region surrounding said element portion, said first junction terminal region having said second conductivity type, said first junction terminal region having an impurity concentration lower than an impurity concentration of said charge compensation region, said first guard ring region being provided to be separated from said first junction terminal region in said termination portion at said interface, said first guard ring region surrounding said element portion at said interface, said first guard ring region having said second conductivity type;

forming said second range after the step of forming said first range, the step of forming said second range including the step of forming a second breakdown voltage holding layer and the step of forming a channel forming region and a source region, said second breakdown voltage holding layer constituting said interface and having said first conductivity type, said channel forming region being provided in said element portion at said second breakdown voltage holding layer and having said second conductivity type, said source region being provided at said channel forming region, said source region being separated from said second breakdown voltage holding layer by said channel forming region, said source region having said first conductivity type, said first and second breakdown voltage holding layers constituting a breakdown voltage holding region in said element portion;

forming a gate insulating film having a portion connecting said second breakdown voltage holding layer and said source region to each other on said channel forming region;

forming a gate electrode for switching between an ON state and an OFF state of the silicon carbide semiconductor device, said gate electrode being provided on said gate insulating film;

forming a first main electrode facing said first main surface; and forming a second main electrode in contact with said source region on said second main surface, when voltage is applied between said first and second main electrodes to attain a maximum electric field strength of 0.4 MV/cm or more in said breakdown voltage holding region during said OFF state, a maximum electric field strength in said second range within said element portion being configured to be less than ⅔ of a maximum electric field strength in said first range.

* * * * *